United States Patent
Ha

(10) Patent No.: US 9,805,787 B2
(45) Date of Patent: Oct. 31, 2017

(54) CALIBRATION CIRCUIT AND MEMORY DEVICE INCLUDING THE SAME

(71) Applicant: Samsung Electronics Co., Ltd., Suwon-si (KR)

(72) Inventor: Kyung-soo Ha, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/334,082

(22) Filed: Oct. 25, 2016

(65) Prior Publication Data

US 2017/0154668 A1   Jun. 1, 2017

(30) Foreign Application Priority Data

Nov. 26, 2015  (KR) .................. 10-2015-0166418

(51) Int. Cl.
| | |
|---|---|
| *G11C 5/06* | (2006.01) |
| *G11C 11/4094* | (2006.01) |
| *G11C 7/12* | (2006.01) |
| *G11C 11/4096* | (2006.01) |
| *H03K 19/00* | (2006.01) |

(52) U.S. Cl.
CPC ............ *G11C 11/4094* (2013.01); *G11C 7/12* (2013.01); *G11C 11/4096* (2013.01); *H03K 19/0005* (2013.01)

(58) Field of Classification Search
CPC ..................................... G11C 7/12; G11C 5/06
USPC ................................. 365/189.11, 63
See application file for complete search history.

(56) References Cited

U.S. PATENT DOCUMENTS

| | | | |
|---|---|---|---|
| 6,456,124 B1 | 9/2002 | Lee et al. | |
| 6,815,970 B2 | 11/2004 | Rost et al. | |
| 7,251,305 B2* | 7/2007 | Gauthier | H03L 7/0812 375/226 |
| 7,528,626 B2* | 5/2009 | Kim | H03K 19/0005 326/30 |
| 7,642,864 B2 | 1/2010 | Chuang et al. | |
| 7,859,296 B2 | 12/2010 | Kim et al. | |
| 7,893,710 B2* | 2/2011 | Lee | H04L 25/0278 326/30 |
| 7,911,223 B2 | 3/2011 | Kim et al. | |
| 8,067,956 B2 | 11/2011 | Lee | |
| 8,344,751 B2 | 1/2013 | Cho | |
| 8,397,199 B2 | 3/2013 | Soni et al. | |

(Continued)

FOREIGN PATENT DOCUMENTS

KR   10-0893579   4/2009

*Primary Examiner* — Michael Tran
(74) *Attorney, Agent, or Firm* — Muir Patent Law, PLLC

(57) ABSTRACT

A memory device may include a calibration circuit configured to perform a calibration operation of generating a pull-up control code and a pull-down control code in a calibration mode, and in a stress applying mode, turn on at least one of each of first and second transistor units to apply stress, and an on-die termination (ODT)/off-chip driver (OCD) circuit, a resistance value of the ODT/OCD circuit being adjusted in response to at least one of the pull-up control code and the pull-down control code. The calibration circuit includes a pull-up control code generator including the first transistor unit and a pull-down control code generator including the second transistor unit.

19 Claims, 21 Drawing Sheets

(56) References Cited

U.S. PATENT DOCUMENTS

| | | |
|---|---|---|
| 8,531,898 B2 | 9/2013 | Seol et al. |
| 8,564,324 B2 | 10/2013 | Wuidart |
| 9,620,184 B1 * | 4/2017 | Bialas, Jr. ............ G11C 29/021 |
| 2013/0227183 A1 * | 8/2013 | Shaeffer .............. G06F 13/1684 |
| | | 710/104 |
| 2017/0077927 A1 * | 3/2017 | Lee ................... H03K 19/0005 |
| 2017/0103797 A1 * | 4/2017 | Fang .................... G06F 3/0604 |

* cited by examiner

[CALIBRATION MODE]

[OFF MODE]

[STRESS APPLYING MODE]

[CALIBRATION MODE, OFF MODE]

[STRESS APPLYING MODE]

[STRESS APPLYING MODE]

CALIBRATION CIRCUIT AND MEMORY DEVICE INCLUDING THE SAME

CROSS-REFERENCE TO RELATED APPLICATION

This application claims priority under 35 USC §119 to Korean Patent Application No. 10-2015-0166418, filed on Nov. 26, 2015, in the Korean Intellectual Property Office, the disclosure of which is incorporated herein in its entirety by reference.

BACKGROUND

The present disclosure relates to a memory device, and more particularly, to a calibration circuit having a stress applying mode and a memory device including the same.

In memory devices widely applied to high-performance electronic systems, a capacity and a speed have been increased. As an example of the memory devices, dynamic random access memories (DRAMs) are volatile memories and are memories where data is determined based on an electric charge stored in a capacitor.

A memory device may include an on-die termination (ODT) circuit and/or an off-chip driver (OCD) for preventing distortion of a signal transmitted between a memory controller and the memory device. A resistance (or impedance) of the ODT/OCD circuit is controlled by a control code generated by a calibration circuit. The calibration circuit performs a ZQ calibration operation of generating a pull-up control code and a pull-down control code which are converted based on conditions such as a process, a voltage, and a temperature (PVT).

The ODT/OCD circuit gets stressed in various forms depending on a memory operation, and in this case, the impedance matching characteristic of the ODT/OCD circuit is typically degraded, causing an increase in distortion of a signal. Thus, the calibration circuit may need to compensate the impedance matching characteristic of the ODT/OCD circuit.

SUMMARY

The present disclosure provides a calibration circuit and a memory device including the same, which decrease distortion of a signal caused by various stresses such as negative bias temperature instability (NBTI).

According to aspects of the inventive concept, a memory device that includes a calibration circuit configured to perform a calibration operation of generating a pull-up control code and a pull-down control code in a calibration mode of the memory device, the calibration circuit including a first set of transistors to which the pull-up control code is supplied, a second set of transistors to which the pull-down control code is supplied, and a third set of transistors connected to a first pad, and an output driver circuit, a resistance value of the output driver circuit being adjusted in response to at least one of the pull-up control code and at least one bit of the pull-down control code. The calibration circuit is configured such that the pull-up control code has a logic state which activates at least one transistor of the first set of transistors in the calibration mode and in a first mode of the memory device different from the calibration mode.

According to other aspects of the inventive concept, a calibration circuit for controlling an output driver circuit of a memory device. The calibration circuit may include a first set of PMOS transistors configured to be used to generate a pull-up control code that is supplied to the output driver circuit, a first code control circuit configured to supply a first internal code to the first set of PMOS transistors in a calibration mode and to generate the pull-up control code according to a calibration result, a first set of NMOS transistors configured to be used to generate a pull-down control code supplied to the output driver circuit, and a second code control circuit configured to supply a second internal code to the first set of NMOS transistors in the calibration mode and to generate the pull-down control code according to a calibration result, wherein the calibration circuit is configured such that the pull-up control code has a logic state which activates at least one PMOS transistor of the first set of PMOS transistors in the calibration mode and in a stress applying mode different from the calibration mode.

According to still other aspects of the inventive concept, a memory device may include a calibration circuit including a first set of transistors connected to a first power voltage, a second set of transistors connected to the first set of transistors and a second power voltage, and a third set of transistors connected to a first pad, the calibration circuit configured to, when the memory device is in a calibration mode, generate a first pull-up control code supplied to the first set of transistors and to generate a first pull-down control code supplied to the second set of transistors. The calibration circuit my be configured to, in the calibration mode, generate the first pull-up control code having a logic state which activates at least one transistor of the first set of transistors, and in a first mode of the memory device different from the calibration mode, generate the first pull-up control code having a logic state which activates at least one transistor of the first set of transistors.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
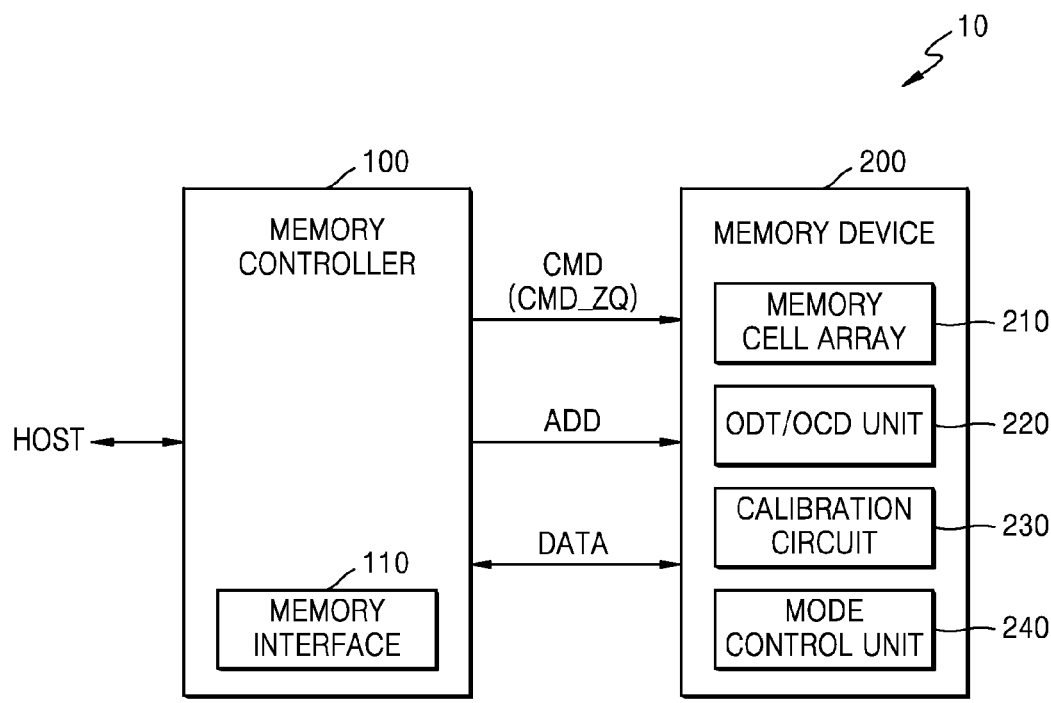
FIG. 1 is a block diagram illustrating a memory system according to example embodiments.

FIG. 1 is a block diagram illustrating a memory system 10 according to example embodiments.

As illustrated in FIG. 1, the memory system 10 may include a memory controller 100 and a memory device 200. The memory controller 100 may include a memory interface 110 and may supply various signals to the memory device 200 to control a memory operation such as writing and reading of data and the like. For example, the memory controller 100 may supply a command CMD and an address ADD to the memory device 200 to access data DATA of a memory cell array 210. The command CMD may include commands associated with various memory operations such as writing and reading of data and the like. Also, when the memory device includes a DRAM cell, the command CMD may include commands for executing various unique operations relevant to a DRAM, and for example, may include a refresh command for refreshing memory cells.

The memory controller 100 may access the memory device 200 according to a request from a host HOST (not shown). The memory controller 100 may communicate with the host by using various protocols, and for example, the memory controller 100 may communicate with the host by using an interface protocol such as peripheral component interconnection-express (PIC-E), advanced technology attachment (ATA), serial-ATA (SATA), parallel-ATA (PATA), or serial attached SCSI (SAS). In addition, other various interface protocols such as universal serial bus (USB), multimedia card (MMC), enhanced small disk interface (ESDI), and integrated drive electronics (IDE) may be applied as a protocol for communication between the host and the memory controller 100.

The memory device 200 may include the memory cell array 210, an on-die termination (ODT)/off-chip driver (OCD) unit 220, a calibration circuit 230, and a mode control unit 240. As used herein, a "unit" may refer to a "circuit," or a "block. The OCD/ODT unit 220 may include an OCD circuit and/or an ODT circuit. According to an embodiment, in the memory device 200, the OCD circuit and the ODT circuit may be implemented independently from each other. The OCD/ODT unit 220 may be referred to as an output driver, an output buffer, or an output circuit. In example embodiments, the OCD circuit may include a pull-up unit and a pull-down unit, and one of the pull-up unit and the pull-down unit may be used as the ODT circuit. For example, the pull-up unit of the OCD circuit may include a plurality of transistors and a plurality of resistors, and moreover, the pull-down unit of the OCD circuit may include a plurality of transistors and a plurality of resistors. For example, the pull-up unit of the OCD circuit may be used as the ODT circuit.

In embodiments, the OCD/ODT unit 220 may be variously defined. For example, the OCD/ODT unit 220 may be referred to as the ODT circuit, or may be referred to as the OCD circuit. Alternatively, the OCD/ODT unit 220 may correspond to the OCD circuit, and the ODT circuit may correspond to one of elements of the OCD circuit. Also, for example, it may be described that the memory device 100 includes a plurality of data pads, the OCD/ODT unit 220 includes a plurality of OCD circuits, and some (for example, a pull-up unit) of each of the plurality of OCD circuits configure the ODT circuit. In example embodiments, the OCD circuit may be used to transfer data from the memory device 200 to the memory controller 100 (e.g., read operation), and the ODT circuit may be used to transfer data from the memory controller 100 to the memory device 200 (e.g., write operation).

The calibration circuit 230 may generate various control codes for adjusting a resistance value of the OCD/ODT unit 220. For example, the calibration circuit 230 may enter into a calibration mode periodically or during an initial operation of memory device 200 and perform a calibration operation in the calibration mode. In the calibration operation, the various control codes may be generated based on a feedback operation. For example, the calibration circuit 230 may generate a pull-up control code for adjusting a resistance value of the pull-up unit of the OCD/ODT unit 220 and may also generate a pull-down control code for adjusting a resistance value of the pull-down unit of the OCD/ODT unit 220.

When the calibration operation is completed, the calibration circuit 230 may enter an off mode. In the off mode, the calibration circuit 230 may be disabled. In the off mode, the calibration circuit 230 may not perform the calibration operation based on the feedback operation and may maintain an operation where the pull-up/pull-down control code generated in the calibration mode is supplied to the OCD/ODT unit 220.

The mode control unit 240 may control an operation mode of the calibration circuit 230. According to an embodiment, the calibration circuit 230 may execute a stress applying mode according to control by the mode control unit 240. The stress applying mode may include, for example, read, write, high frequency, high temperature, active, refresh operations, etc., which are different from the calibration mode. In the stress applying mode, stress may be applied to at least one of some elements included in the calibration circuit 230. For example, negative bias temperature instability (NBTI) stress may be applied to at least one of some elements included in the calibration circuit 230. In example embodiments, the NBTI stress may be applied to the calibration circuit 230 by using an NBTI enable signal generated by a command decoder (shown in FIGS. 16 and 17) or the mode control unit 240.

For example, the OCD/ODT unit 220 may include a plurality of PMOS transistors. Also, the calibration circuit 230 may include a plurality of PMOS transistors relevant to generation of the pull-up control code and a plurality of NMOS transistors relevant to generation of the pull-down control code. In a normal operation (e.g., read or write operation) of the OCD/ODT unit 220, the NBTI stress may be applied to the plurality of PMOS transistors. According to an embodiment, in the stress applying mode, the NBTI stress may be applied to the plurality of PMOS transistors included in the calibration circuit 230 identically or similarly to the normal operation of the OCD/ODT unit 220.

An NBTI effect may be applied to the PMOS transistors of the pull-up unit of the OCD/ODT unit 220 (or the PMOS transistors of the ODT circuit) according to a negative bias being applied to a gate and a source of each of the PMOS transistors in the normal operation, and for this reason, as time elapses, characteristics such as threshold voltages, turn-on currents, and/or the like of the PMOS transistors are changed. If the characteristics of the PMOS transistors are changed, the impedance mismatching of the ODT circuit may occur, causing degradation in signal integrity. According to an embodiment, the calibration circuit 230 may operate in the stress applying mode where stress (for example, the NBTI stress) corresponding to the NBTI effect of the OCD/ODT unit 220 is applied thereto. By executing the stress applying mode, the characteristics of the plurality of PMOS transistors included in the calibration circuit 230 may be changed identically or similarly to the OCD/ODT unit 220. Therefore, the calibration circuit 230 may compensate the NBTI effect of the OCD/ODT unit 220.

According to an embodiment, the memory controller 100 may supply a calibration command CMD_ZQ for commanding calibration periodically or in an initial operation of the memory device 200. Also, according to an embodiment, in the stress applying mode, the calibration circuit 230 may apply stress to the plurality of NMOS transistors relevant to generation of the pull-down control code. That is, stress may be applied to the NMOS transistors of the calibration circuit 230 identically or similarly to stress which is applied to the NMOS transistors of the OCD/ODT unit 220 in the normal operation.

Figure 2:
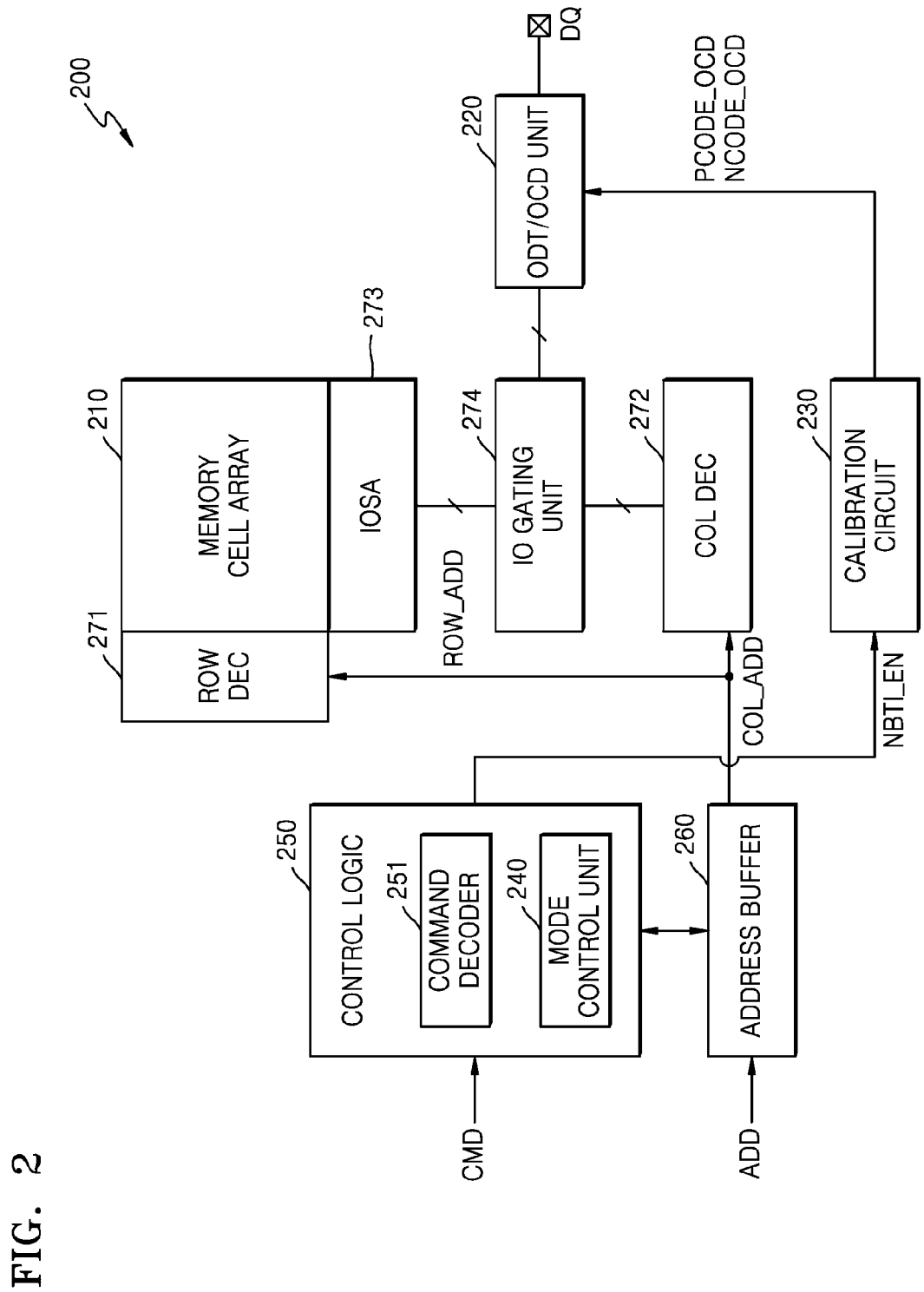
FIG. 2 is a block diagram illustrating an implementation example of a memory device illustrated in FIG. 1 according to example embodiments.

FIG. 2 is a block diagram illustrating an implementation example of the memory device illustrated in FIG. 1 according to example embodiments. A memory device 200 illustrated in FIG. 2 is merely an implementation example, and the stress applying mode for a calibration circuit 230 according to embodiments may be applied to the memory device 200 in various forms.

The memory device 200 may be a DRAM such as a double data rate synchronous dynamic random access memory (DDR SDRAM), a low power double data rate (LPDDR) SDRAM, a graphics double data rate (GDDR) SDRAM, a Rambus dynamic random access memory (RDRAM), or the like. In example embodiments, the memory device 200 may use various kinds of memory devices to which an OCD/ODT circuit is applied. For example, when the OCD/ODT circuit is applied to a nonvolatile memory such as a resistive memory device, a flash memory device, or the like, the memory device 200 may use a non-volatile memory.

The memory device 200 may include a memory cell array 210, an OCD/ODT unit 220, a calibration circuit 230, a mode control unit 240, and a control logic 250. In FIG. 2, an example where the mode control unit 240 is included in the control logic 250 is illustrated, but the present embodiment is not limited thereto. In other embodiments, the mode control unit 240 may be provided outside the control logic 250.

The memory device 200 may further include various elements for a memory operation. For example, the memory device 200 may further include an address buffer 260 that stores an address ADD received from the outside the memory device 200, a row decoder 271 for selecting rows of the memory cell array 210, a column decoder 272 for selecting columns of the memory cell array 210, an input/output (IO) sense amplifier 273, and an IO gating unit 274 that performs gating of IO data DATA.

The address buffer 260 may receive the address ADD from the memory controller 240. The address ADD may include a row address ROW_ADD for indicating a row of the memory cell array 210 and a column address COL_ADD for indicating a column of the memory cell array 210. The IO gating unit 274 may supply data, read from the memory cell array 210, to the outside through the OCD/ODT unit 220. Also, an input buffer (not shown) may be provided inside or outside the OCD/ODT unit 220, and in a data write operation, data may be supplied to the memory cell array 210 through the input buffer and the IO gating unit 274.

The control logic 250 may control an overall operation of the memory device 200, and for example, may include a command decoder 251. A kind of a command CMD supplied to the memory device 200 may be determined based on a decoding result of the command CMD. Also, the control logic 250 may perform various determination operations in association with an operation mode of the calibration circuit 230. The mode control unit 240 may generate a control signal for controlling an operation mode of the calibration circuit 230, based on various determination results of the control logic 250. According to an embodiment, a stress enable signal NBTI_EN may be activated in order for the calibration circuit 230 to operate in the stress applying mode.

The stress enable signal NBTI_EN may be activated at various timings, and for example, may be activated during a certain period according to predetermined information. For example, at least one of PMOS transistors (for example, PMOS transistors included in a pull-up unit) of the OCD/ODT unit 220 may maintain a turn-on state in a data write operation, and thus, the NBTI effect applied to the PMOS transistors of the OCD/ODT unit 220 may be relatively large in the data write operation. Therefore, when a write command is applied to the memory device 200, the stress enable signal NBTI_EN may be activated, and thus, stress may also be applied to the calibration circuit 230.

Moreover, for example, as time elapses, the NBTI effect applied to the PMOS transistors of the OCD/ODT unit 220 increases, and thus, the stress enable signal NBTI_EN may be periodically or aperiodically activated with the elapse of time. For example, the number of various commands (for example, a write/read command, etc.) applied to the memory device 200 may be counted, and the stress enable signal NBTI_EN may be activated based on a result of the counting. For example, the memory device 200 may include a timer (not shown), and the stress enable signal NBTI_EN may be activated at certain time intervals.

The calibration circuit 230 may generate a pull-up control code PCODE_OCD and a pull-down control code NCODE_OCD for adjusting a resistance value of the OCD/ODT unit 220. For example, as the NBTI stress is applied to the PMOS transistors included in the calibration circuit 230, characteristics of the PMOS transistors are changed, and then, a value of the pull-up control code PCODE_OCD and/or a value of the pull-down control code NCODE_OCD may be changed in a calibration operation. The NBTI effect of the OCD/ODT unit 220 may be compensated according to the changed pull-up control code PCODE_OCD and/or pull-down control code NCODE_OCD.

Figure 3:
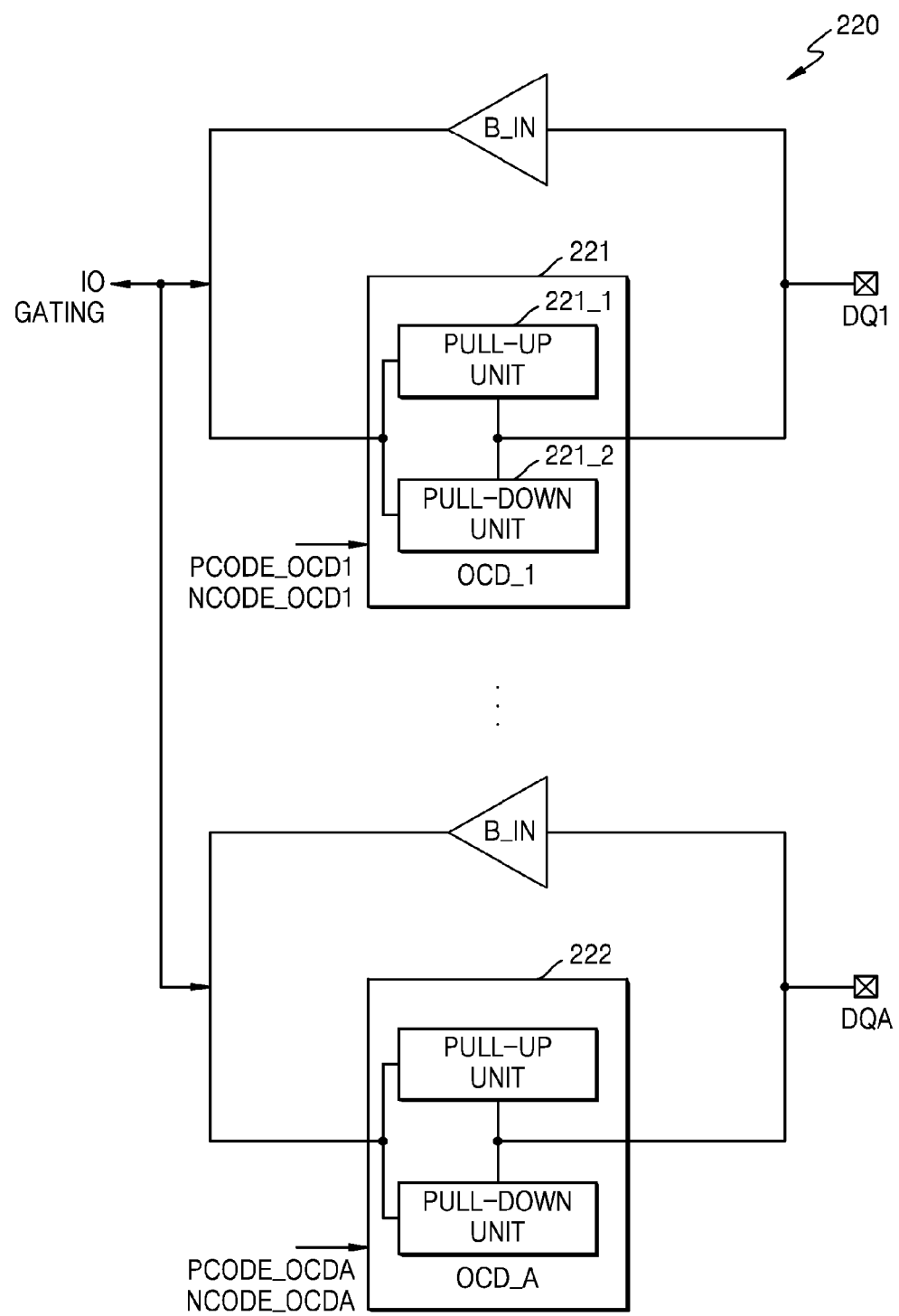
FIG. 3 is a block diagram illustrating an implementation example of an OCD/ODT unit of FIG. 2 according to example embodiments.

FIG. 3 is a block diagram illustrating an implementation example of the OCD/ODT unit 220 of FIG. 2 according to example embodiments. In FIG. 3, an example where some of elements of an OCD circuit that output read data operates as an ODT circuit is illustrated.

Referring to FIGS. 2 and 3, the memory device 220 may include a plurality of data pads DQ1 to DQA for inputting/outputting data, and the OCD/ODT unit 220 may include an OCD/ODT circuit in correspondence with each of the data pads DQ1 to DQA. For example, the OCD/ODT unit 220 may include a first OCD/ODT circuit 221 in correspondence with a first data pad DQ1 and may include an Ath OCD/ODT circuit 222 in correspondence with an Ath data pad DQA. A pull-up control code and a pull-down control code may be provided in correspondence with each of the OCD/ODT circuits, and for example, a first pull-up control code PCODE_OCD1 and a first pull-down control code NCODE_OCD1 may be supplied to the first OCD/ODT circuit 221.

As described above, a concept of the OCD/ODT unit 220 may be variously defined, and for example, the OCD/ODT unit 220 may be defined as including a plurality of OCD/ODT circuits. Alternatively, the OCD/ODT unit 220 may be defined as corresponding to one OCD/ODT circuit. In the following description, a pull-up unit of an OCD circuit may perform a function of an ODT circuit, and thus, the OCD/ODT circuit may be referred to as an OCD circuit.

An example of an operation of the OCD/ODT unit 220 illustrated in FIG. 3 will be described with reference to a first OCD circuit 221.

The first OCD circuit 221 may include a pull-up unit 221_1 and a pull-down unit 221_2. The pull-up unit 221_1 may include a plurality of transistors (for example, a plurality of PMOS transistors) and a plurality of resistors, and switching of the transistors of the pull-up unit 221_1 may be controlled in response to the first pull-up control code PCODE_OCD1. Also, the pull-down unit 221_2 may include a plurality of transistors (for example, a plurality of NMOS transistors) and a plurality of resistors, and switching of the transistors of the pull-down unit 221_2 may be controlled in response to the first pull-down control code NCODE_OCD1.

In a data read operation, read data may be supplied to the first OCD circuit 221 through IO gating. In the data read operation, signal integrity of data supplied to outside the memory device 200 may be enhanced according to impedance matching of the pull-up unit 221_1 and pull-down unit 221_2 of the first OCD circuit 221.

In a data write operation, data may be supplied to the memory device 200 through an input buffer B_IN and IO gating. At this time, the transistors of the pull-down unit 221_2 may be turned off, but at least one of transistors of the pull-up unit 221_1 may be turned on, whereby a termination resistance may be supplied to an input terminal of the input buffer B_IN. For example, the PMOS transistors of the pull-up unit 221_1 may have an on/off pattern based on the first pull-up control code PCODE_OCD1, and thus, at least one of the PMOS transistors may be turned on. Accordingly, due to impedance matching of the pull-up unit 221_1, signal integrity of data supplied from the outside is enhanced.

Figure 4:
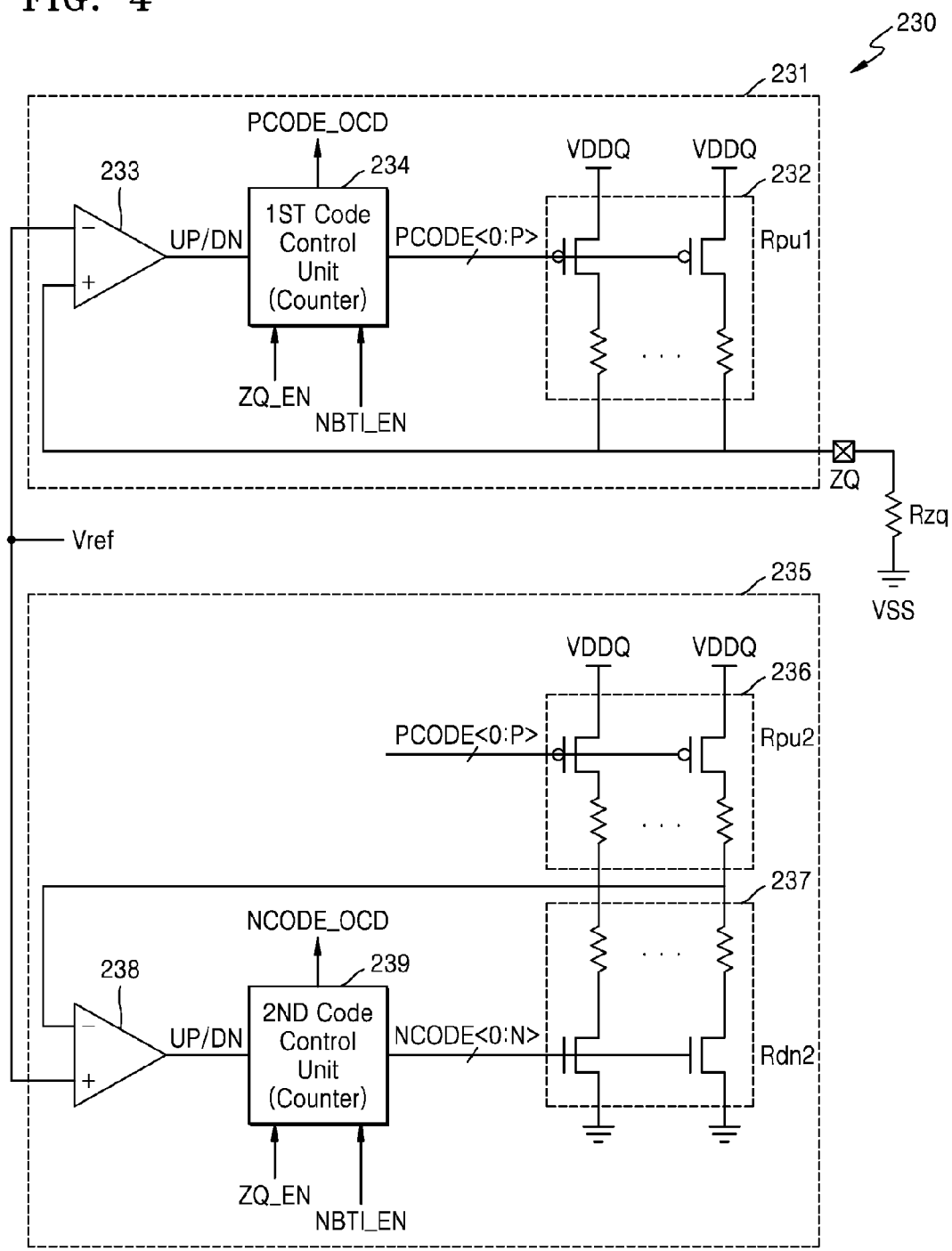
FIG. 4 is a circuit diagram illustrating an implementation example of a calibration circuit of FIG. 1 according to example embodiments.

FIG. 4 is a circuit diagram illustrating an implementation example of the calibration circuit of FIG. 1 according to example embodiments.

Referring to FIGS. 1 to 4, the calibration circuit 230 may include a pull-up control code generator 231, which generates the pull-up control code PCODE_OCD, and a pull-down control code generator 235 that generates the pull-down control code NCODE_OCD. The pull-up control code generator 231 may be connected to an external resistor Rzq through a pad (e.g., ZQ pad). The external resistor Rzq may be a resistor provided outside the memory device 200, and one end of the external resistor Rzq may be connected to a ground voltage VSS. According to an embodiment, the calibration circuit 230 may be implemented in order for the pull-down control code generator 235 to be connected to the external resistor Rzq through the pad.

The pull-up control code generator 231 may include a first transistor unit 232, a first comparator 233, and a first code control unit 234. The first transistor unit 232 may include a plurality of first transistors which are connected to each other in parallel and a plurality of resistors which are connected to each other in parallel. For example, each of the parallelly connected plurality of first transistors may be a PMOS transistor connected to a power voltage VDDQ. Also, the first code control unit 234 may include a counter and may receive a calibration enable signal ZQ_EN and the stress enable signal NBTI_EN.

The pull-down control code generator 235 may include a replica transistor unit 236, a second transistor unit 237, a second comparator 238, and a second code control unit 239. The replica transistor unit 236 may include a plurality of replica transistors which are connected to each other in parallel and a plurality of resistors which are connected to each other in parallel. The replica transistors may have characteristics which are substantially the same as those of the PMOS transistors of the first transistor unit 232.

The second transistor unit 237 may include a plurality of second transistors which are connected to each other in parallel and a plurality of resistors which are connected to each other in parallel. For example, each of the parallelly connected plurality of second transistors may be an NMOS transistor connected to a ground voltage. Also, the second code control unit 239 may include a counter and may receive the calibration enable signal ZQ_EN and the stress enable signal NBTI_EN.

Each of the first and second transistor units 232 and 237 included in the calibration circuit 230 may correspond to the replica transistor of the OCD/ODT circuit. For example, the PMOS transistors of the first transistor unit 232 may have characteristics which are substantially the same as those of the PMOS transistors of the pull-up unit of the OCD/ODT circuit. Also, the NMOS transistors of the second transistor unit 237 may have characteristics which are substantially the same as those of the NMOS transistors of the pull-down unit of the OCD/ODT circuit.

A detailed operation example of the calibration circuit 230 illustrated in FIG. 4 will be described below.

In the calibration mode, the first comparator 233 may compare a reference voltage Vref with a voltage of a ZQ pad to output an up/down signal UP/DN. The first code control unit 234 may generate a first internal code PCODE<0:P> which allows a pull-up resistor Rpu1 of the first transistor unit 232 to have the same value as that of the external resistor Rzq, based on a counting operation for the up/down signal UP/DN. At least a first transistor of the first transistor unit 232 may be turned on, and an equivalent resistance based on resistances of the plurality of resistors and turn-on resistance of the first transistor of the first transistor unit 232 may become equal to a resistance of the external resistor Rzq.

The generated first internal code PCODE<0:P> may be supplied to the replica transistor unit 236 of the pull-down control code generator 235, and thus, a resistance of a replica pull-up resistor Rpu2 of the replica transistor unit 236 may become equal to that of the pull-up resistor Rpu1. Also, the second code control unit 239 may generate a second internal code NCODE<0:N> which allows a pull-down resistor Rpu2 of the second transistor unit 237 to have the same value as that of the external resistor Rzq.

The pull-up control code PCODE_OCD for allowing the pull-up resistor of the OCD/ODT unit 220 to have a target value may be generated based on a generation result of the first internal code PCODE<0:P>, and the pull-down control code NCODE_OCD for allowing the pull-down resistor of the OCD/ODT unit 220 to have a target value may be generated based on a generation result of the second internal code NCODE<0:N>. For example, positions of some PMOS transistors of the first transistor unit 232 which are turned on based on an on/off pattern of the first internal code PCODE<0:P> may become the same as those of some PMOS transistors of the pull-up unit of the OCD/ODT unit 220 which are turned on based on an on/off pattern of the pull-up control code PCODE_OCD. For example, if the pull-up control code PCODE_OCD is not converted, the first internal code PCODE<0:P> and the pull-up control code PCODE_OCD may have the same on/off pattern.

Subsequently, when the calibration enable signal ZQ_EN is deactivated (or when the off mode is entered), the first and second code control units 234 and 239 may be turned off, and thus, the calibration operation may end. In the off mode, each of the pull-up control code PCODE_OCD and the pull-down control code NCODE_OCD may be supplied to the OCD/ODT unit 220 in a state of maintaining a current value. For example, the first internal code PCODE<0:P> and the second internal code NCODE<0:N> may all be changed to an off code. For example, when the first internal code PCODE<0:P> has a logic high level (e.g., 1), all the PMOS transistors of the first transistor unit 232 and the replica transistor unit 236 may be turned off. Also, when the second internal code NCODE<0:N> has a logic low level (e.g., 0), all the NMOS transistors of the second transistor unit 237 may be turned off.

According to an embodiment, when the stress applying mode is entered, at least one transistor of each of the first and second transistor units 232 and 237 may be turned on. The first transistor unit 232 being turned on may denote that at least one of the plurality of transistors included in the first transistor unit 232 is turned on. Similarly, the second transistor unit 237 being turned on may denote that at least one of the plurality of transistors included in the second transistor unit 237 is turned on.

In the stress applying mode, the first internal code PCODE<0:P> having an on/off pattern corresponding to the pull-up control code PCODE_OCD may be supplied to the first transistor unit 232. Therefore, the PMOS transistors (or some PMOS transistors) of the first transistor unit 232 may be turned on identically to an on/off pattern of the transistors (for example, the PMOS transistors of the pull-up unit) of the OCD/ODT unit 220. Therefore, at least a first transistor of the first transistor unit 232 may be supplied with a negative bias (e.g., a voltage between a gate and a source of the first transistor), and thus, the NBTI stress may be applied to the first transistor unit 232, based on the NBTI effect which occurs in the OCD/ODT unit 220.

While the stress enable signal NBTI_EN is being activated, the replica transistor unit 236 may receive the first internal code PCODE<0:P>, and thus, the NBTI stress may be applied to the replica transistor unit 236. The NBTI effect may occur in a PMOS transistor which is turned on by the negative bias, and thus, while the stress enable signal NBTI_EN is being activated, all the transistors of the second transistor unit 237 may be turned off. In an embodiment, while the stress enable signal NBTI_EN is being activated, the transistors of the second transistor unit 237 may also be controlled to be put in an on/off state identically to the transistors (for example, the NMOS transistors) of the pull-down unit of the OCD/ODT unit 220, and for example, the second code control unit 239 may supply the second internal code NCODE<0:N> having a certain on/off pattern to the second transistor unit 237 in response to the stress enable signal NBTI_EN. In this case, characteristics of the NMOS transistors of the calibration circuit 230 may be changed identically or similarly to characteristics of the NMOS transistors of the OCD/ODT unit 220 being changed with the elapse of time.

Figure 5:
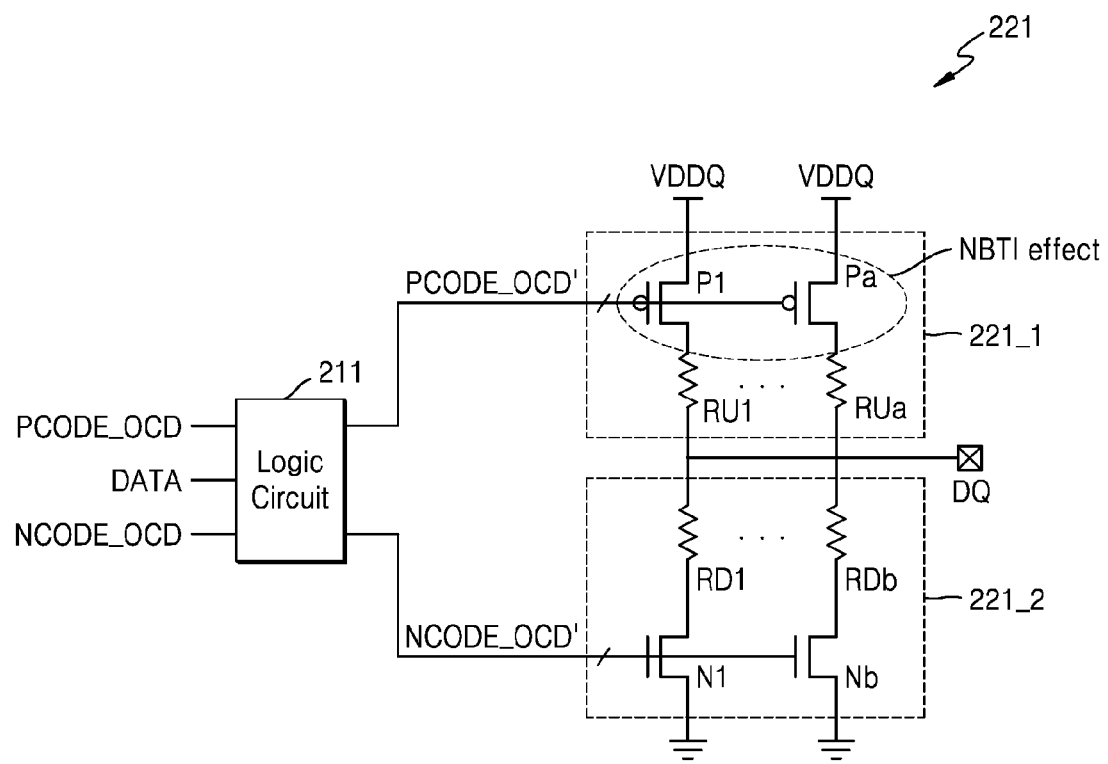
FIG. 5 is a circuit diagram illustrating an implementation example of an OCD/ODT unit of FIG. 1 according to example embodiments.

FIG. 5 is a circuit diagram illustrating an implementation example of an OCD/ODT unit of FIG. 1 according to example embodiments. In FIG. 5, an implementation example of an OCD circuit connected to one data pad DQ is illustrated.

Referring to FIGS. 4 and 5, an OCD circuit 221 may include a pull-up unit 221_1 and a pull-down unit 221_2. The pull-up unit 221_1 may include a plurality of PMOS transistors P1 to Pa which are connected to the power voltage VDDQ and are arranged in parallel. Also, the pull-up unit 221_1 may further include a plurality of resistors RU1 to RUa which are connected between the PMOS transistors P1 to Pa and a data pad DQ. The PMOS transistors P1 to Pa may be turned on/off to have a pattern based on the pull-up control code PCODE_OCD. The pull-up unit 221_1 and the pull-down unit 221_2 may each be used as an output buffer (e.g., OCD circuit) in reading data, and the pull-up unit 221_1 may be used as an on-die termination (ODT) resistor in writing data.

The pull-down unit 221_2 may include a plurality of NMOS transistors N1 to Nb which are connected to the ground voltage and are arranged in parallel. Also, the pull-down unit 221_2 may further include a plurality of resistors RD1 to RDb which are connected between the NMOS transistors N1 to Nb and the data pad DQ. The NMOS transistors N1 to Nb may be turned on/off to have a pattern based on the pull-down control code NCODE_OCD.

In example embodiments, OCD circuit 221 may include a logic circuit 211. The logic circuit 211 may receive data from the memory cell array 210, the pull-up control code PCODE_OCD, and the pull-down control code NCODE_OCD, and output a pull-up control code PCODE_OCD' and a pull-down control code NCODE_OCD'. The pull-up control code PCODE_OCD' and the pull-down control code NCODE_OCD' are applied to the pull-up unit 221_1 and the pull-down unit 221_2.

In a data write operation, at least one of the PMOS transistors P1 to Pa of the pull-up unit 221_1 may be turned on according to the pull-up control code PCODE_OCD. On the other hand, if the calibration circuit 230 does not operate in the stress applying mode, the PMOS transistors included in the calibration circuit 230 may maintain a turn-off state during a period other than a period where the calibration mode is intermittently executed. For example, the NBTI effect may be repeatedly applied to the PMOS transistors P1 to Pa of the pull-up unit 221_1 of the OCD circuit 221, but the NBTI effect may be hardly applied to the PMOS transistors included in the calibration circuit 230. Accordingly, characteristics such as threshold voltages of the PMOS transistors P1 to Pa of the pull-up unit 221_1 may differ from those of the PMOS transistors included in the calibration circuit 230. In this case, even though the pull-up control code PCODE_OCD having the same value as the first internal code PCODE<0:P> is supplied to the OCD circuit 221, when characteristics of the PMOS transistors P1 to Pa are changed, a pull-up resistance value of the OCD circuit 221 is also changed, causing degradation in signal integrity.

In example embodiments, while the calibration circuit 230 is operating in the stress applying mode, the NBTI stress may be applied to the calibration circuit 230, and for this reason, characteristics of the PMOS transistors of the calibration circuit 230 may be changed identically or similarly to the OCD circuit 221. For example, as time elapses, a value of the pull-up control code PCODE_OCD generated by the calibration circuit 230 is changed due to the NBTI stress, and a pull-up resistance value of the OCD circuit 221 may be maintained according to the changed pull-up control code PCODE_OCD.

Figure 6:
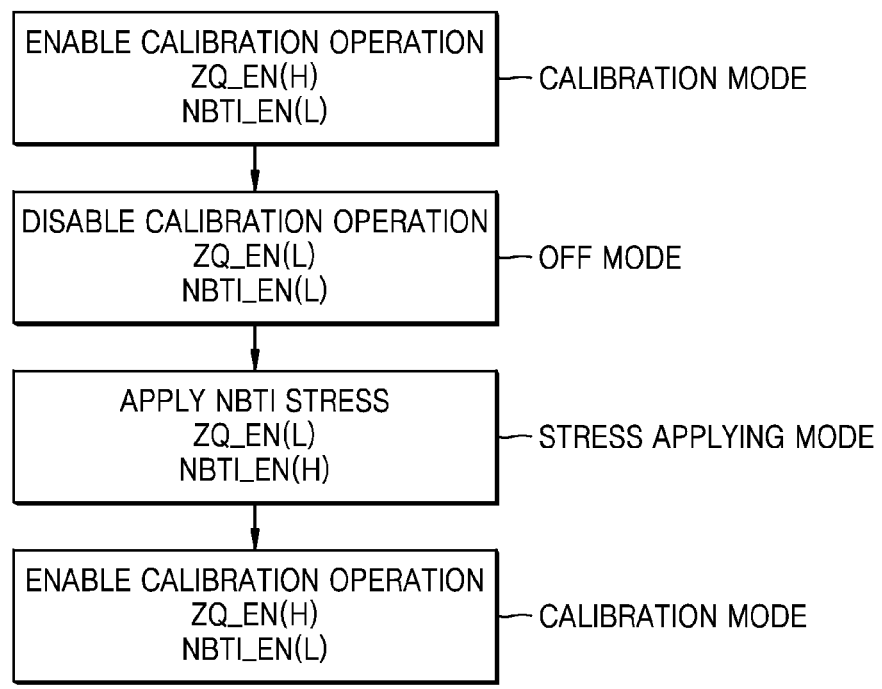
FIG. 6 is a block diagram illustrating an example of an operation mode applied to a calibration circuit according to example embodiments.

FIG. 6 is a block diagram illustrating an example of an operation mode applied to a calibration circuit according to example embodiments.

Referring to FIG. 6, the calibration circuit may operate in a plurality of modes. For example, the calibration circuit may operate in the calibration mode periodically or in an initial operation of a memory device. In the calibration mode, the calibration enable signal ZQ_EN may be activated, and the stress enable signal NBTI_EN may be deactivated. A pull-up control code and a pull-down control code for adjusting a resistance of an OCD/ODT circuit may be generated according to a calibration operation being enabled.

When the pull-up control code and the pull-down control code reach a target value in the calibration mode, the calibration circuit may enter the off mode. In the off mode, the calibration enable signal ZQ_EN and the stress enable signal NBTI_EN may be deactivated, and thus, a calibration operation may be disabled. In the off mode, the calibration circuit may maintain the pull-up control code and the pull-down control code which have reached the target value, and may supply the pull-up control code and the pull-down control code to the OCD/ODT circuit. On the other hand, internal codes which are used for the calibration circuit to generate the pull-up control code and the pull-down control code may be changed to have a certain value (for example, an off code), and thus, all transistors (for example, PMOS and NMOS transistors) applied by the pull-up control code and the pull-down control code may be turned off.

According to the embodiments, the calibration circuit may enter the stress applying mode. In the stress applying mode, the calibration enable signal ZQ_EN may be deactivated, and the stress enable signal NBTI_EN may be activated. In the stress applying mode, the NBTI stress may be applied to at least some of elements included in the calibration circuit. For example, the negative bias may be applied to at least a first PMOS transistor of the PMOS transistors which are used for the calibration circuit to generate the pull-up control code, and thus, the NBTI stress may be applied to the first PMOS transistor of the PMOS transistors of the calibration circuit.

In example embodiments, the stress applying mode may be entered in various methods. For example, a memory controller may directly provide a command for requesting the stress applying mode. For another example, a memory device may control the calibration circuit in order for the stress applying mode to be executed for some memory of a memory system, and for example, the stress applying mode may be executed in a data write operation. For example, the stress applying mode may be periodically or aperiodically executed based on a counting operation associated with the number of time detections or memory operations.

When the stress applying mode ends, the calibration circuit may alternately enter the calibration mode, the off mode, and the stress applying mode. For example, characteristic of at least one of the PMOS transistors of the calibration circuit is changed, and thus, the calibration circuit may generate the pull-up control code and/or the pull-down control code having a value which differs from a value applied to a previous calibration circuit.

Figure 7:
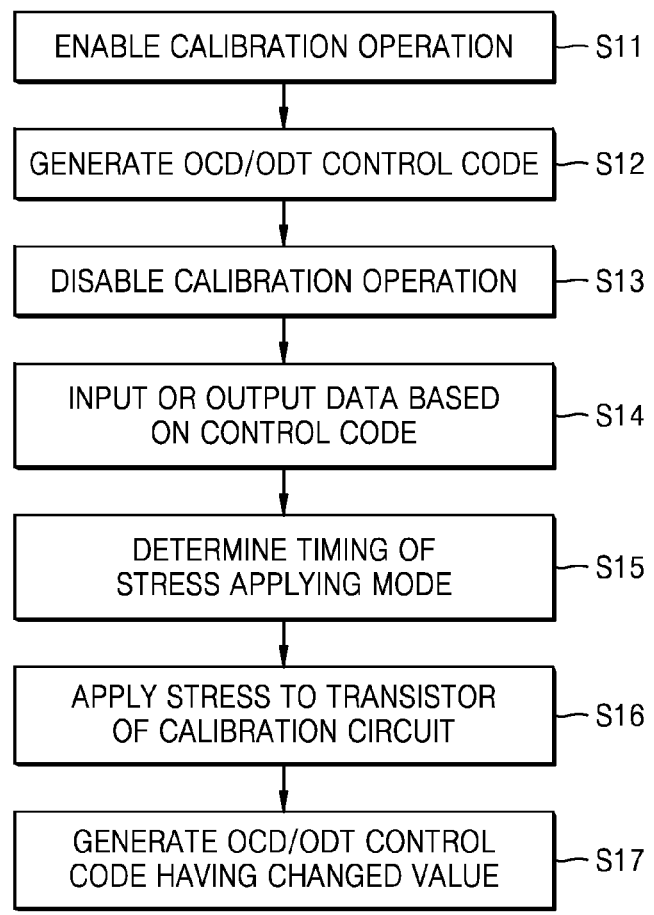
FIG. 7 is a flowchart illustrating an operation example of a memory device according to example embodiments.

FIG. 7 is a flowchart illustrating an operation example of a memory device according to example embodiments.

Referring to FIG. 7, when a calibration operation is enabled in operation S11, and OCD/ODT control code for adjusting a resistance value of an OCD/ODT circuit may be generated in operation S12. The OCD/ODT circuit may include a pull-up unit including a pull-up resistor and a pull-down unit including a pull-down resistor, and the OCD/ODT control code may include a pull-up control code and a pull-down control code.

When the OCD/ODT control code reaches a target value, a calibration operation may be disabled in operation S13. Subsequently, the OCD/ODT control code may be supplied to the OCD/ODT circuit in a state of maintaining the target value, and an input/output of data may be performed based on the OCD/ODT control code in operation S14. For example, a pull-up resistance and a pull-down resistance of the OCD/ODT circuit may be adjusted based on the pull-up/pull-down control code, an output of data may be performed based on the pull-up/pull-down resistance, and an input of data may be performed based on the pull-up resistance. For example, in a read operation if data from the memory cell array is "1" an output of data may be performed based on the pull-up control code, and data from the memory cell array is "0" an output of data may be performed based on the pull-down control code.

Subsequently, a time for entering the stress applying mode may be determined in operation S15, and based on a result of the determination, stress may be applied to at least one of transistors of a calibration circuit in the stress applying mode in operation S16. For example, the NBTI stress may be applied to at least a first PMOS transistor of the PMOS transistors included in the calibration circuit. Characteristic of the first PMOS transistor of the PMOS transistors is changed due to the applied NBTI stress, and thus, when the calibration operation is again enabled, the OCD/ODT control code having a changed value may be generated in operation S17.

Figure 8:
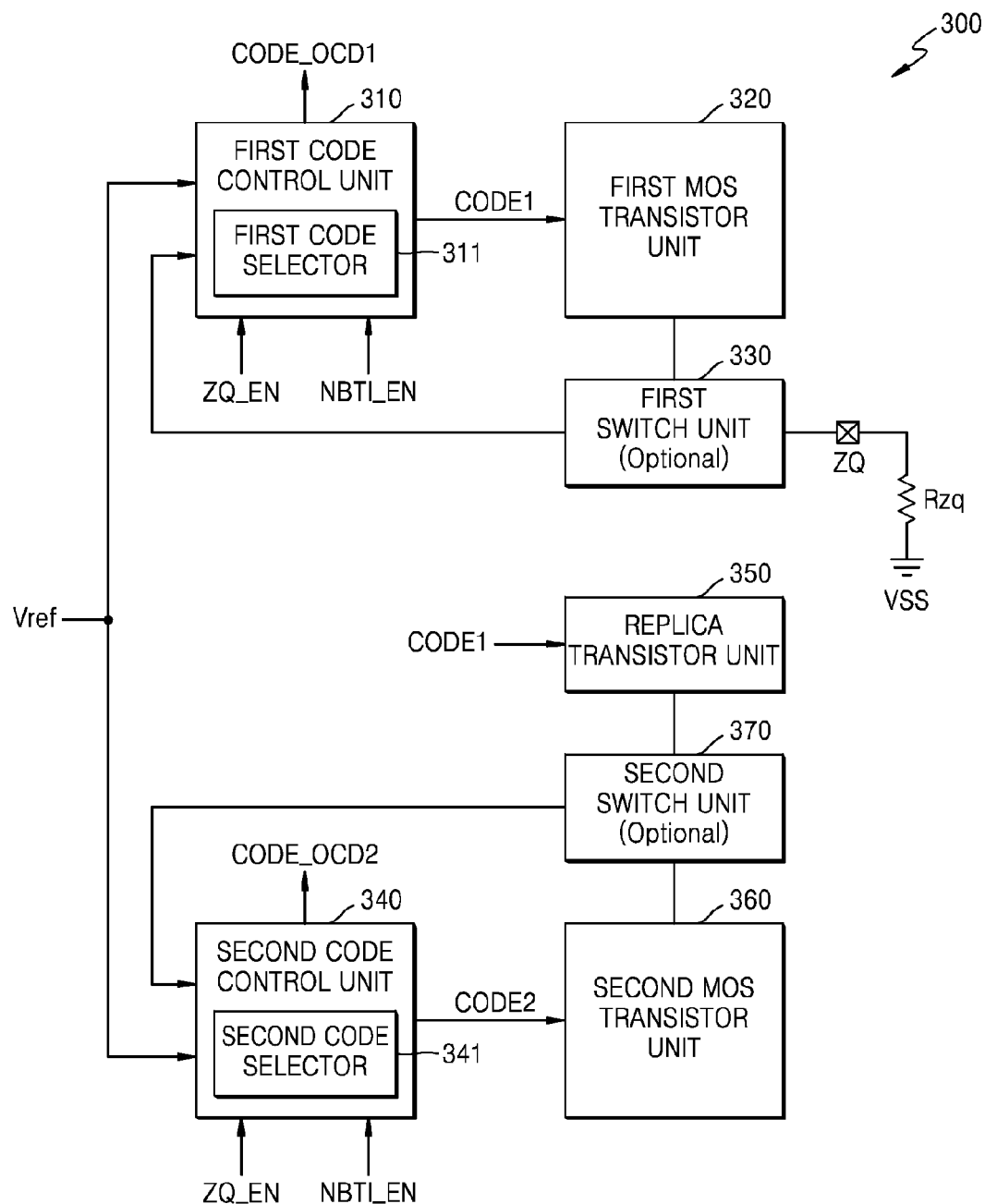
FIG. 8 is a block diagram illustrating an implementation example of a calibration circuit having a stress applying mode according to example embodiments.

FIG. 8 is a block diagram illustrating an implementation example of a calibration circuit having the stress applying mode according to example embodiments. In describing an operation of a calibration circuit 300 illustrated in FIG. 8, an operation of generating an OCD/ODT control code in the calibration mode is the same as or similar to the above-described embodiments, and thus, its detailed description is not repeated.

Referring to FIG. 8, the calibration circuit 300 may include a first code control unit 310, a first MOS transistor unit 320, and a first switch unit 330. Also, the calibration circuit 300 may further include a second code control unit 340, a replica transistor unit 350, a second MOS transistor unit 360, and a second switch unit 370. The calibration circuit 300 may generate the above-described pull-up control code and pull-down control code. For example, the first code control unit 310, the first MOS transistor unit 320, and the first switch unit 330 may configured one of a pull-up control code generator and a pull-down control code generator.

Moreover, the second code control unit 340, the replica transistor unit 350, the second MOS transistor unit 360, and the second switch unit 370 may configure the other one of the pull-up control code generator and the pull-down control code generator. Also, an external resistor Rzq may be connected to a power voltage VDD (or VDDQ) or a ground voltage VSS. The first MOS transistor unit 320 may be connected to the external resistor Rzq through a pad (for example, a ZQ pad). According to an embodiment, when the external resistor Rzq is connected to the ground voltage VSS, the first code control unit 310, the first MOS transistor unit 320, and the first switch unit 330 may configured the pull-up control code generator.

According to an embodiment, the first switch unit 330 and the second switch unit 370 may be provided for decreasing consumption of a current in the stress applying mode. In the calibration circuit 300 of FIG. 8, the first and second switch units 330 and 370 may each be an optional element, and the calibration circuit 300 may not include the first and second switch units 330 and 370. For example, the calibration circuit 300 may include one of the first and second switch units 330 and 370.

In the calibration mode, the first code control unit 310 may generate a first internal code CODE1 which allows a resistance of the first MOS transistor unit 320 to have the same value as that of the external resistor Rzq, based on a result of comparison and counting which are performed for a reference voltage Vref and a voltage of a node connected to the ZQ pad. Also, the second code control unit 340 may generate a second internal code CODE2 which allows a resistance of the second MOS transistor unit 360 to have the same value as that of the external resistor Rzq. The first and second switch units 330 and 370 may be turned on while the calibration operation is being performed. When the calibration operation ends, a pull-up control code CODE_OCD1 and a pull-down control code CODE_OCD2 may be supplied to an OCD/ODT unit.

When the calibration operation ends, each of a first code selector 311 and a second code selector 341 may provide an internal code corresponding to an off code. For example, after the calibration operation ends, all transistors of the first MOS transistor unit 320 may be turned off according to the first internal code CODE1. Also, all transistors of the second MOS transistor unit 360 may be turned off according to the second internal code CODE2.

When a stress enable signal NBTI_EN is activated, the calibration circuit 300 may enter the stress applying mode, and the first and second switch units 330 and 370 may be turned off. Also, the first code selector 311 may supply the first internal code CODE1, having the same or similar on/off pattern as/to that of the pull-up control code CODE_OCD1, to the first MOS transistor unit 320, and thus, at least a first transistor of the first MOS transistor unit 320 may be turned on. Stress, which is the same as or similar to stress applied to at least a first transistor of the OCD/ODT unit, may be applied to the turned-on first transistor, and a current path based on the external resistor Rzq may be blocked according to the first switch unit 330 being turned off, thereby decreasing consumption of a current.

For example, when the stress enable signal NBTI_EN is activated, the second code selector 341 may supply the second internal code CODE2, having the same or similar on/off pattern as/to that of the pull-down control code CODE_OCD2, to the second MOS transistor unit 360, and thus, at least a first transistor of the second MOS transistor unit 360 may be turned on. Stress may be applied to the turned-on transistor. As another example, when the stress enable signal NBTI_EN is activated, the second internal code CODE2 may have a logic state which deactivates the second MOS transistor unit 360, and thus, all of the second MOS transistor unit 360 may be turned off.

Hereinafter, detailed operations of a calibration circuit according to embodiments will be described.

Figure 9A:
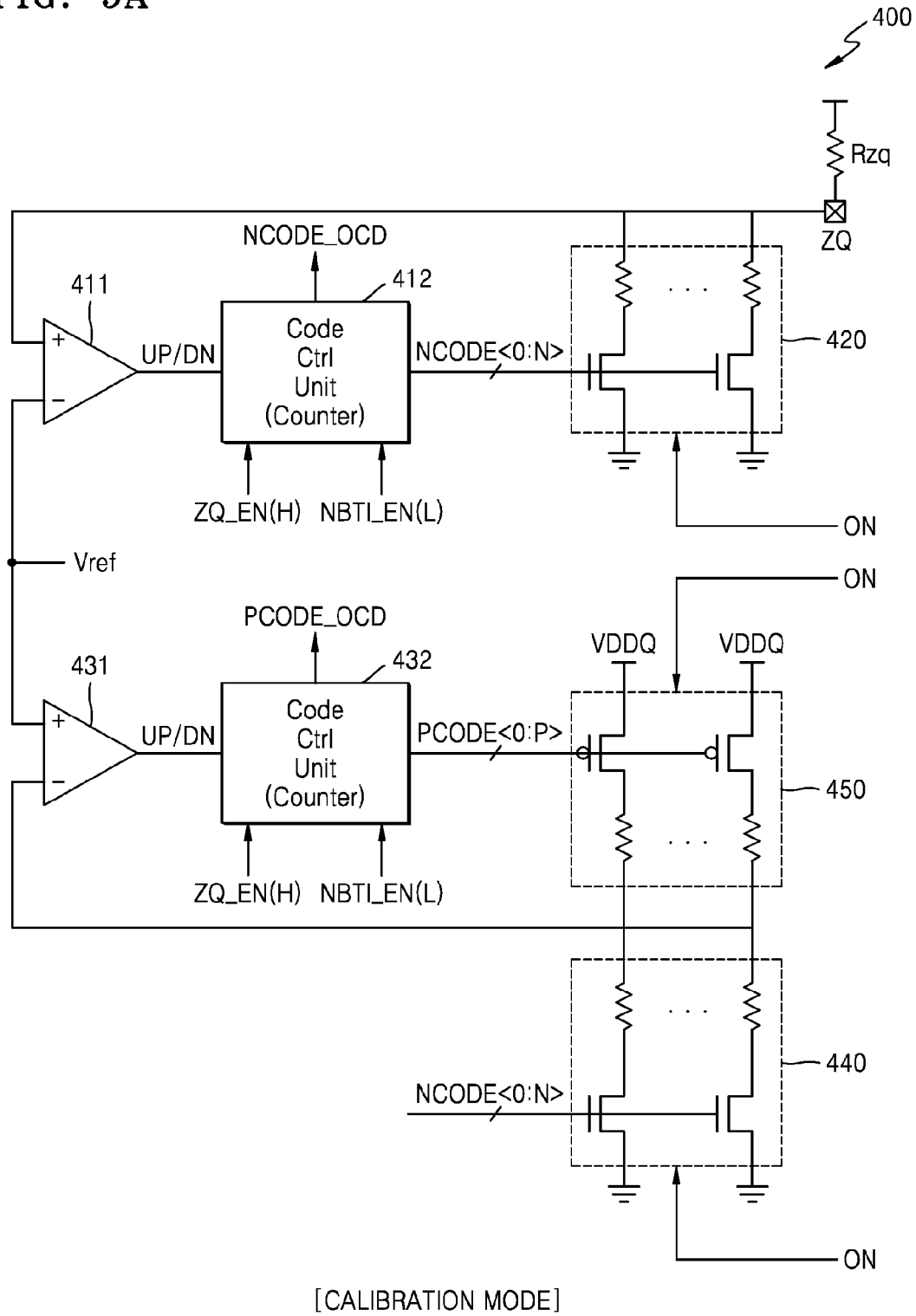
FIGS. 9A, 9B and 10 are circuit diagrams illustrating a configuration of a calibration circuit according to example embodiments.
Figure 9B:
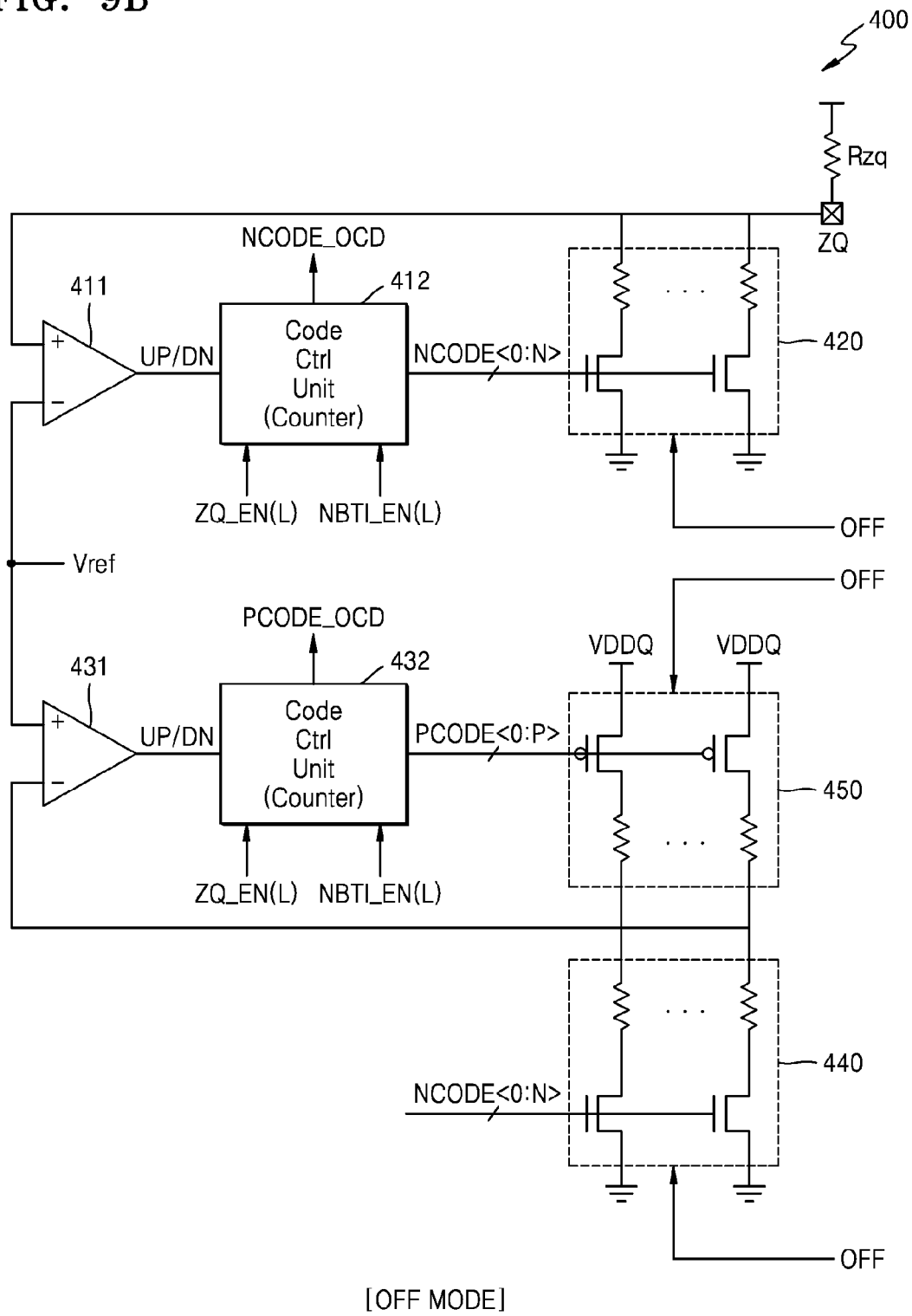
Figure 10:
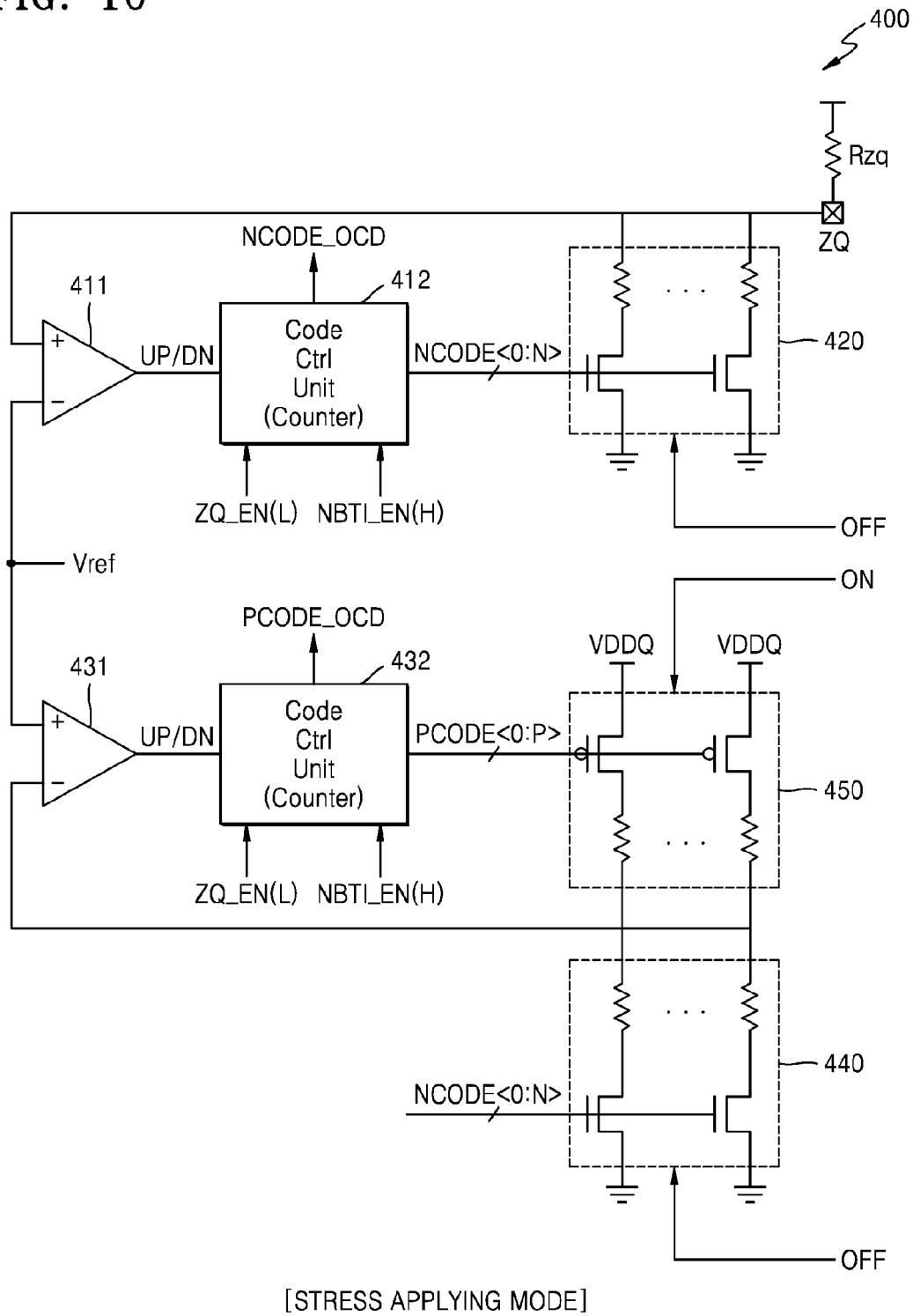

FIGS. 9A, 9B and 10 are circuit diagrams illustrating a configuration of a calibration circuit according to example embodiments. An example of an operation corresponding to each of the calibration mode and the off mode is illustrated in FIGS. 9A and 9B, and an example of an operation corresponding to the stress applying mode is illustrated in FIG. 10.

Referring to FIG. 9A, a calibration circuit 400 may include a first comparator 411, a first code control unit 412, and a first MOS transistor unit 420. The first comparator 411, the first code control unit 412, and the first MOS transistor unit 420 may configure a pull-down control code generator. The first MOS transistor unit 420 may be connected to an external resistor Rzq through a pad (e.g., ZQ pad), and the external resistor Rzq may be connected to a power voltage (VDD or VDDQ). Also, the first MOS transistor unit 420 may include a plurality of NMOS transistors and a plurality of resistors.

Also, the calibration circuit 400 may include a second comparator 431, a second code control unit 432, a replica transistor unit 440, and a second MOS transistor unit 450. The second comparator 431, the second code control unit 432, the replica transistor unit 440, and the second MOS transistor unit 450 may configure a pull-up control code generator. Also, the replica transistor unit 440 may include elements which are the same as those of the first MOS transistor unit 420, and the second MOS transistor unit 450 may include a plurality of PMOS transistors and a plurality of resistors. As in an embodiment illustrated in FIG. 8, each of the first and second code control units 412 and 432 may include a code selector (not shown).

In the embodiment of FIG. 9A, as the external resistor Rzq is connected to the power voltage, the first MOS transistor unit 420 associated with generation of the pull-down control code may be connected to the ZQ pad. Also, in the elements illustrated in FIG. 9A, the calibration circuit 400 may not include the above-described first and second switch units.

In the calibration mode, a calibration enable signal ZQ_EN may be activated, and a stress enable signal NBTI_EN may be deactivated. In a calibration operation, the first and second MOS transistor units 420 and 450 and the replica transistor unit 440 may be turned on according to internal codes PCODE<0:P> and NCODE<0:N>, and thus, at least one transistor of each of the first and second MOS transistor units 420 and 450 and the replica transistor unit 440 may be turned on. Also, a pull-up control code PCODE_OCD and a pull-down control code NCODE_OCD may be generated based on the internal codes PCODE<0:P> and NCODE<0:N> which have reached a target value. In example embodiments, the pull-up control code PCODE_OCD and the pull-down control code NCODE_OCD may be the same as or different from the internal codes PCODE<0:P> and NCODE<0:N>, respectively.

Referring to FIG. 9B, when the calibration enable signal ZQ_EN is deactivated, the calibration circuit 400 may operate in the off mode. The first code control unit 412 may provide, as a first internal code NCODE<0:N>, a code for turning off NMOS transistors of the first MOS transistor unit 420. For example, the first internal code NCODE<0:N> may all have a logic low value in the off mode, and thus, all the NMOS transistors of the first MOS transistor unit 420 may be turned off.

Similarly, NMOS transistors of the replica transistor unit 440 may be turned off according to the first internal code NCODE<0:N>. Also, the second code control unit 432 may provide, as a second internal code PCODE<0:P>, a code for turning off PMOS transistors of the second MOS transistor unit 450. For example, the second internal code PCODE<0:P> may all have a logic high value in the off mode, and thus, all the PMOS transistors of the second MOS transistor unit 450 may be turned off.

Referring to FIG. 10, when the stress enable signal NBTI_EN is activated, the calibration circuit 400 may operate in the stress applying mode. In the stress applying mode, the NBTI stress may be applied to one of the PMOS transistors included in the calibration circuit 400. For example, the second code control unit 432 may supply the second internal code PCODE<0:P>, having an on/off pattern corresponding to the pull-up control code PCODE_OCD which is generated in the calibration mode, to the second MOS transistor unit 450. Therefore, at least one of the PMOS transistors included in the second MOS transistor unit 450 may be turned on, and thus, the NBTI stress may be applied thereto. For example, the NBTI stress may be applied to one of the PMOS transistors of the calibration circuit 400 identically to the NBTI effect which is applied to one of the PMOS transistors of a pull-up unit of an OCD/ODT circuit. In the stress applying mode, the first MOS transistor unit 420 and the replica transistor unit 440 may be turned off identically to the off mode.

In FIGS. 9A, 9B and 10, an example where the stress enable signal NBTI_EN is supplied to the first code control unit 412 is illustrated, but the present embodiment is not limited thereto. For example, when the NBTI stress is not applied to the first MOS transistor unit 420, the stress enable signal NBTI_EN may not be supplied to the first code control unit 412.

Figure 11:
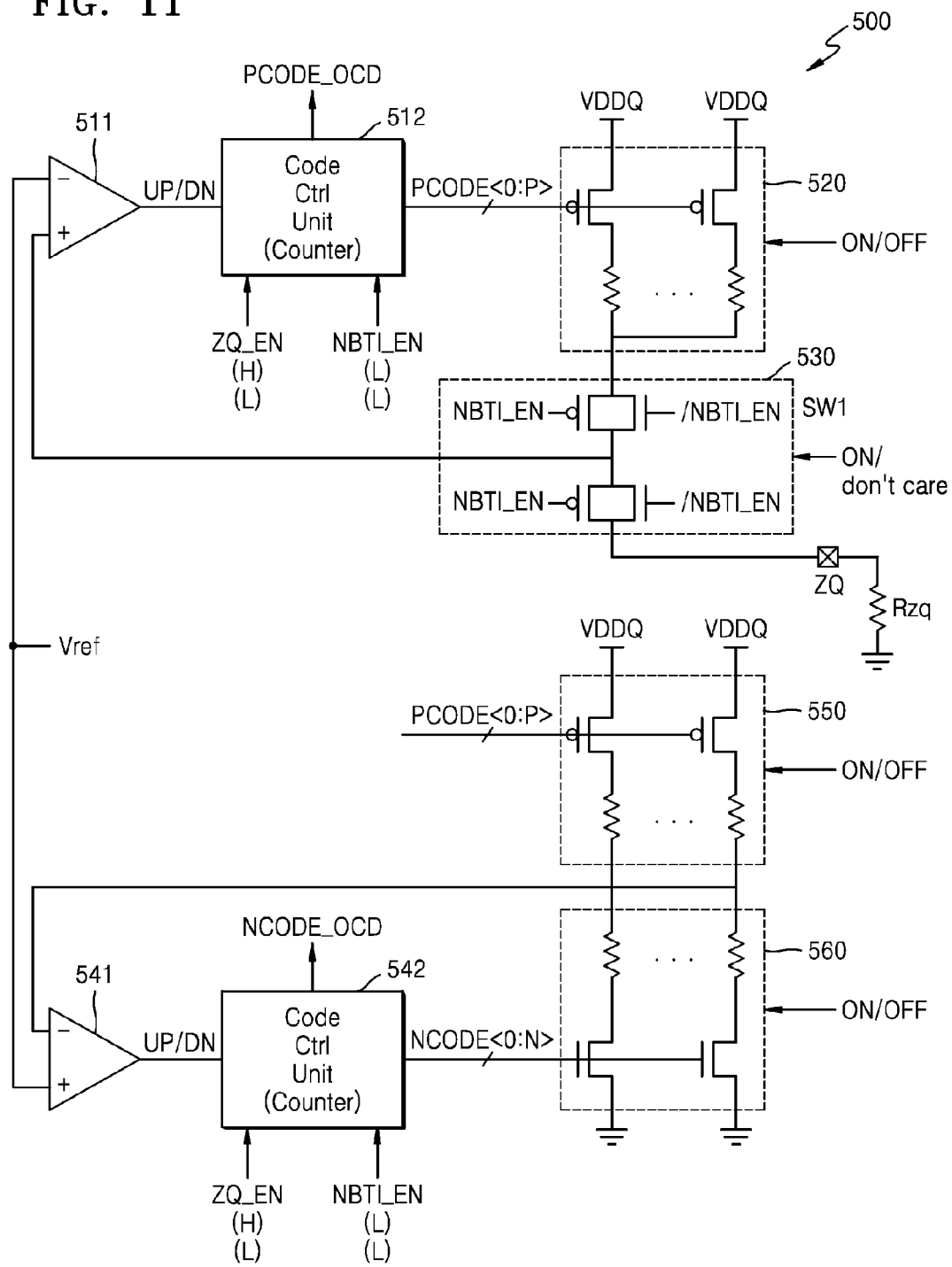
FIGS. 11 and 12 are circuit diagrams illustrating a configuration of a calibration circuit according to example embodiments.
Figure 12:
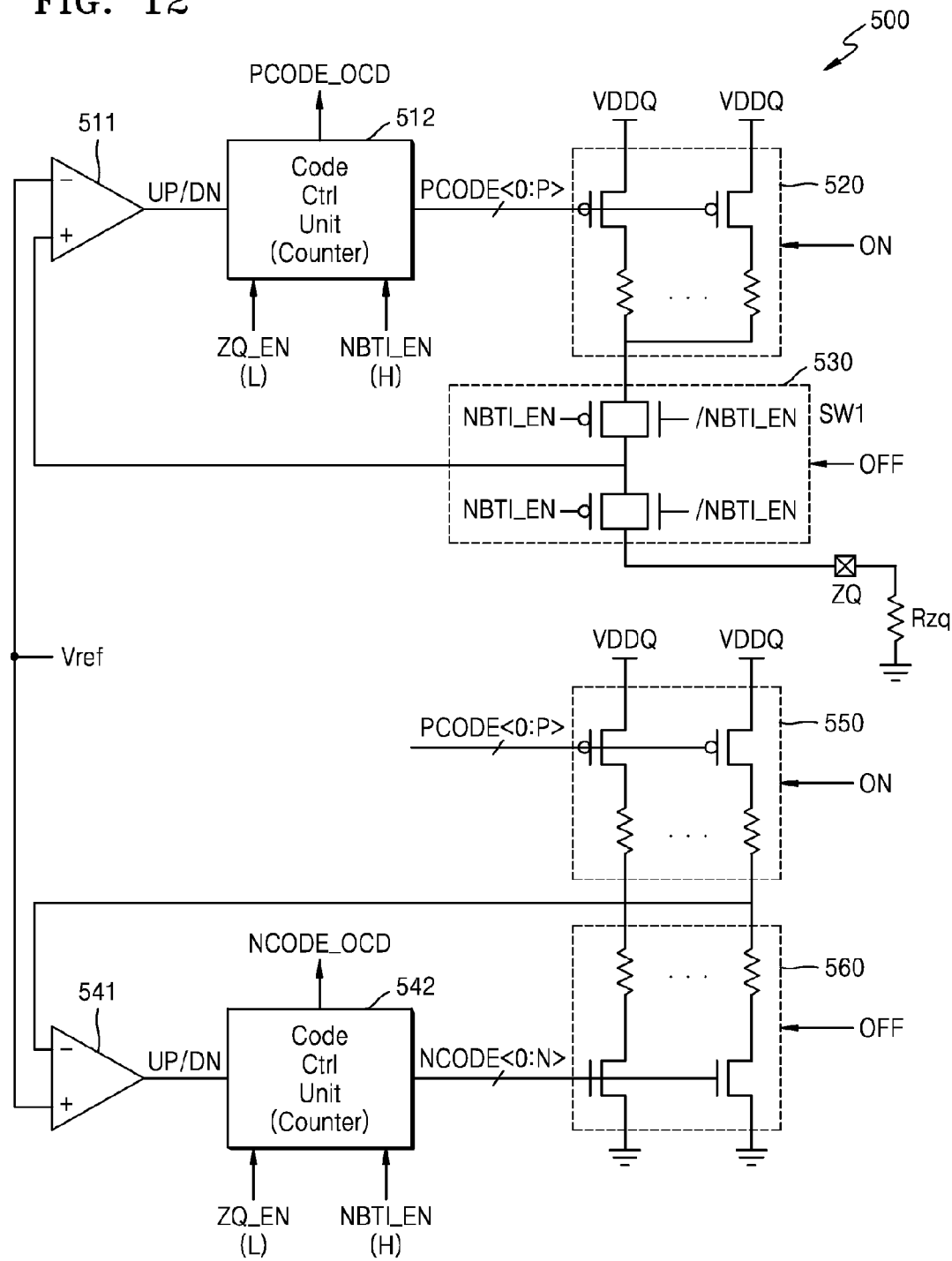

FIGS. 11 and 12 are circuit diagrams illustrating a configuration of a calibration circuit according to example embodiments. An example of an operation corresponding to each of the calibration mode and the off mode is illustrated in FIG. 11, and an example of an operation corresponding to the stress applying mode is illustrated in FIG. 12. In describing a configuration and an operation of a calibration circuit illustrated in FIGS. 11 and 12, detailed descriptions of elements which are the same as or similar to the preceding embodiments are not repeated.

Referring to FIG. 11, a calibration circuit 500 may include a first comparator 511, a first code control unit 512, a first MOS transistor unit 520, and a switch unit (SW1) 530. The first comparator 511, the first code control unit 512, the first MOS transistor unit 520, and the switch unit 530 may configure a pull-up control code generator. The first MOS transistor unit 520 may be connected to an external resistor Rzq through a pad (e.g., ZQ pad), and the external resistor Rzq may be connected to a ground voltage. Also, the first MOS transistor unit 520 may include a plurality of PMOS transistors and a plurality of resistors.

Also, the calibration circuit 500 may include a second comparator 541, a second code control unit 542, a replica transistor unit 550, and a second MOS transistor unit 560. The second comparator 541, the second code control unit 542, the replica transistor unit 550, and the second MOS transistor unit 560 may configure a pull-down control code generator. Also, the replica transistor unit 550 may include elements which are the same as those of the first MOS transistor unit 520, and the second MOS transistor unit 560 may include a plurality of NMOS transistors and a plurality of resistors.

First, in the calibration mode, the pull-up control code PCODE_OCD and the pull-down control code NCODE_OCD may be generated identically or similarly to the above-described embodiment. In the calibration mode, the first MOS transistor unit 520 may be turned on, and simultaneously, the switch unit 530 may be turned on. For example, since the switch unit 530 is turned on, an electrical path between the first MOS transistor 520 and the external resistor Rzq may be formed. Similarly, the replica transistor unit 550 and the second MOS transistor unit 560 may be turned on in the calibration mode.

When the calibration operation ends, the calibration circuit 500 may enter the off mode. In the off mode, the first MOS transistor unit 520 may be turned off. Also, since the first MOS transistor unit 520 is turned off, a current is prevented from being leaked through the ZQ pad and the external resistor Rzq, and thus, the switch unit 530 may be turned on or off. For example, when the switch unit 530 is directly controlled by the stress enable signal NBTI_EN, the switch unit 530 may be turned on. Also, in the off mode, the replica transistor unit 550 and the second MOS transistor unit 560 may be turned off.

Referring to FIG. 12, when the calibration circuit 400 operates in the stress applying mode, the NBTI stress may be applied to at least one of the PMOS transistors included in the calibration circuit 400. For example, the first code control unit 512 may supply the first internal code PCODE<0:P>, having an on/off pattern corresponding to the pull-up control code PCODE_OCD which is generated in the calibration mode, to the first MOS transistor unit 520. Therefore, at least one of the PMOS transistors included in the first MOS transistor unit 520 may be turned on, and thus, the NBTI stress may be applied thereto.

In the stress applying mode, the switch unit 530 may be turned off, and thus, a current path based on the ZQ pad and the external resistor Rzq may be blocked, thereby preventing a current from being leaked. Also, the second MOS transistor unit 560 may be turned off identically to the off mode. Also, at least one of the PMOS transistors of the replica transistor unit 550 may be turned on according to the first internal code PCODE<0:P>. In certain embodiments, when the replica transistor unit 550 receives an internal code independently from the first MOS transistor unit 520, the replica transistor unit 550 may be turned off.

Figure 13:
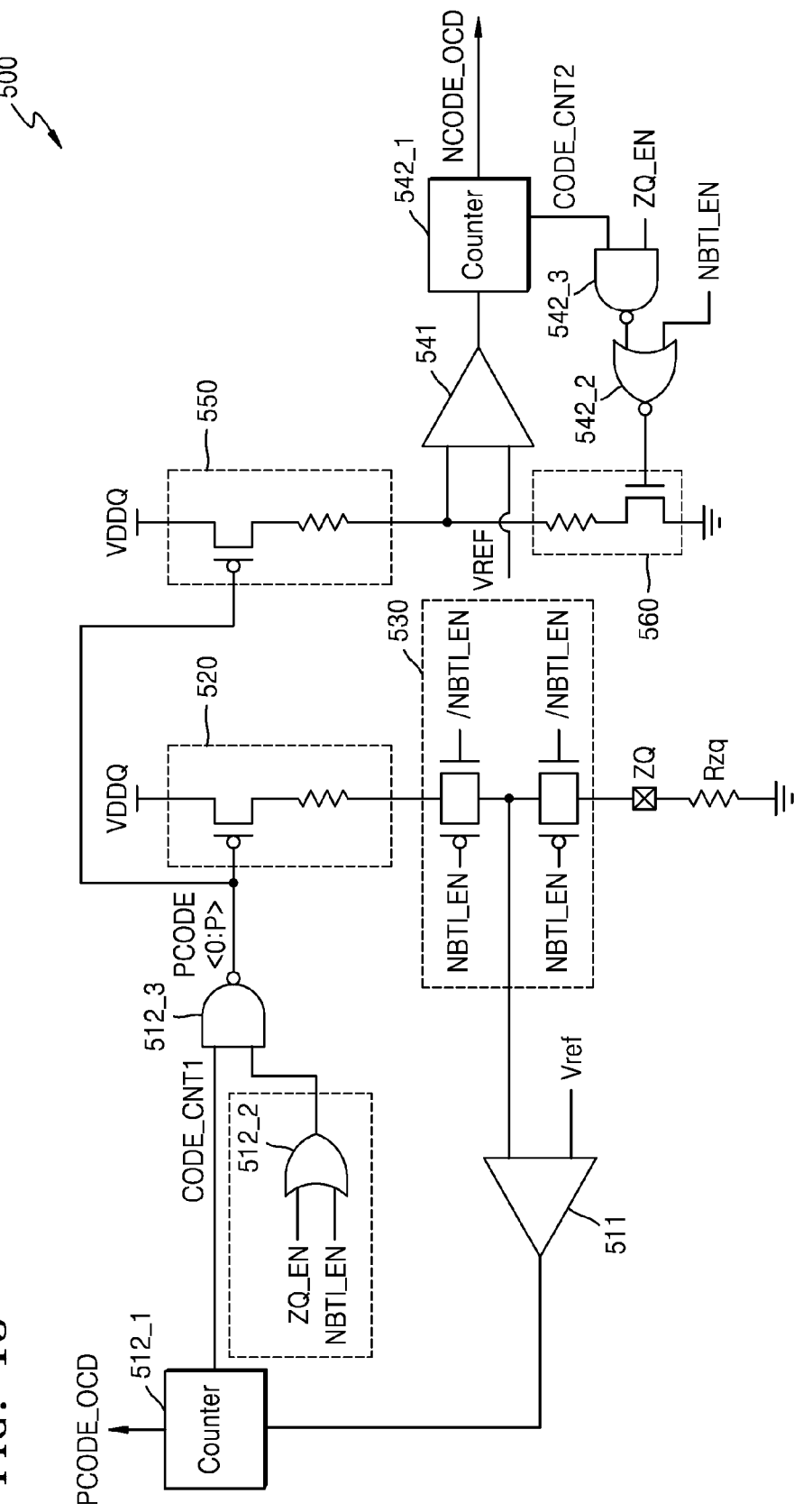
FIG. 13 is a circuit diagram illustrating an example of internal codes generated by a calibration circuit in a plurality of modes according to example embodiments.

FIG. 13 is a circuit diagram illustrating an example of internal codes generated by a calibration circuit in a plurality of modes according to example embodiments. A calibration circuit 500 illustrated in FIG. 13 may correspond to an implementation example of performing the same operation as that of the circuit illustrated in FIG. 12.

Referring to FIGS. 12 and 13, a first code control unit 512 may include a counter 512_1 and one or more logic elements. For example, the first code control unit 512 may include an OR gate 512_2 and an NAND gate 512_3. Also, a second code control unit 542 may include a counter 542_1 and one or more logic elements. For example, the second code control unit 542 may include a NOR gate 542_2, and an NAND gate 542_3.

In FIG. 13, each of the a first MOS transistor unit 520, a replica transistor unit 550, and a second MOS transistor unit 560 may be a plurality of transistors and resistors as described above. For convenience, it is illustrated as including one transistor. Also, FIG. 13 illustrates an example where one end of a second comparator 541 is connected to a reference voltage Vref. However, the one end of the second comparator 541 may be connected to one node included in the switch unit 530 instead of the reference voltage Vref.

The OR gate 512_2 may receive a calibration enable signal ZQ_EN and a stress enable signal NBTI_EN to perform an OR operation. The NAND gate 512_3 may receive an output of the OR gate 512_2 and an output of the counter 512_1. In the calibration mode and the stress applying mode, a value corresponding to a code CODE_CNT1 from the counter 512_1 may be output as a first internal code PCODE<0:P>, and the first internal code PCODE<0:P> may have an on/off pattern. For example, since an output of the OR gate 512_2 has a logic low (e.g., 0) in the off mode, an output of the NAND gate 512_3 may have a logic high irrespective of the code CODE_CNT1 from the counter 512_1, and thus, the first MOS transistor unit 520 may be turned off.

The NAND gate 542_3 may receive the calibration enable signal ZQ_EN and a code CODE_CNT2 to perform a NAND operation. The NOR gate 542_2 may receive an output of the NAND gate 542_3 and a stress enable signal NBTI_EN to perform a NOR operation. In the calibration mode and the stress applying mode, a value corresponding to the code CODE_CNT2 from the counter 542_1 may be output as a second internal code NCODE<0:N>, and the second internal code NCODE<0:N> may have an on/off pattern. For example, the second MOS transistor unit 560 may be turned off irrespective of the code CODE_CNT2 from the counter 542_1 in the stress applying mode and the off mode, and the second MOS transistor unit 560 may be turned on based on the code CODE_CNT2 in the calibration mode.

Figure 14:
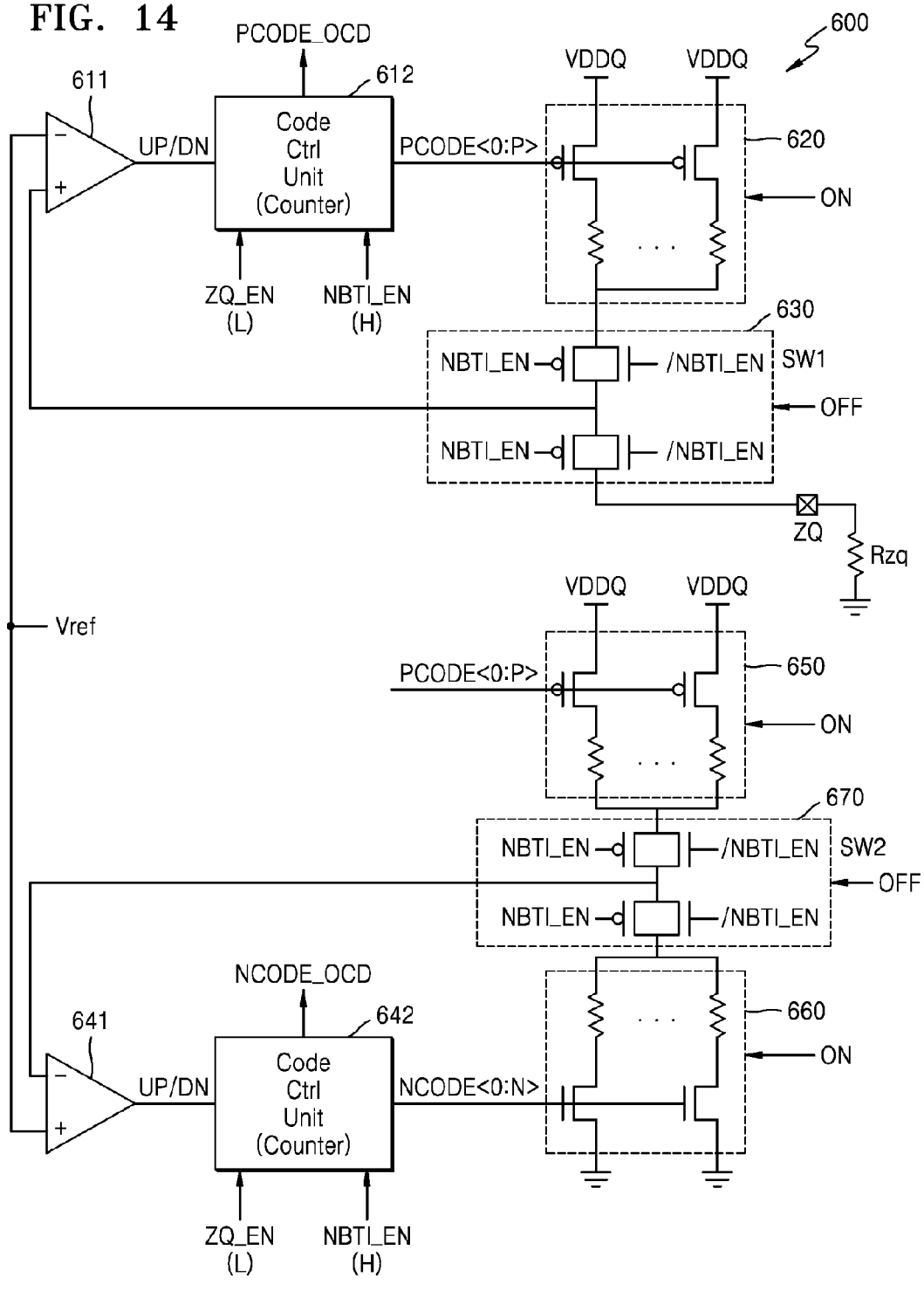
FIG. 14 is a circuit diagram illustrating a configuration of a calibration circuit according to example embodiments.

FIG. 14 is a circuit diagram illustrating a configuration of a calibration circuit according to example embodiments. In the present embodiment, for convenience of description, an example where the calibration circuit operates in the stress applying mode will be described.

Referring to FIG. 14, a calibration circuit 600 may include a first comparator 611, a first code control unit 612, a first MOS transistor unit 620, and a first switch unit (SW1) 630. The first comparator 611, the first code control unit 612, the first MOS transistor unit 620, and the switch unit 630 may configure a pull-up control code generator. The first MOS transistor unit 620 may be connected to an external resistor Rzq through a ZQ pad, and the external resistor Rzq may be connected to a ground voltage. Also, the first MOS transistor unit 620 may include a plurality of PMOS transistors and a plurality of resistors.

Also, the calibration circuit 600 may include a second comparator 641, a second code control unit 642, a replica transistor unit 650, a second MOS transistor unit 660, and a second switch unit (SW2) 670. The second comparator 641, the second code control unit 642, the replica transistor unit 650, the second MOS transistor unit 660, and the second switch unit 670 may configure a pull-down control code generator. Also, the replica transistor unit 650 may include elements which are the same as those of the first MOS transistor unit 620, and the second MOS transistor unit 660 may include a plurality of NMOS transistors and a plurality of resistors.

As the number of operations of a MOS transistor of an OCD/ODT circuit increases with the elapse of time, characteristics of the MOS transistor may be changed, and stress may be applied to the PMOS transistors and the NMOS transistors included in the calibration circuit 600, based on the changed characteristics.

The calibration circuit 600 may periodically or aperiodically enter the stress applying mode. In the stress applying mode, at least one of PMOS transistors of the first MOS transistor unit 620 may be turned on according to the first internal code PCODE<0:P> associated with generation of a pull-up control code PCODE_OCD. Also, the first switch unit 630 may be turned off for decreasing leakage of a current.

Stress may be applied to at least one of the elements configuring the pull-down control code generator, and for example, at least one of PMOS transistors of the replica transistor unit 650 may be turned on according to the first internal code PCODE<0:P>. Also, at least one of NMOS transistors of the second MOS transistor unit 660 may be turned on according to the second internal code NCODE<0:N> associated with generation of a pull-down control code NCODE_OCD. Also, the second switch unit 670 may be turned off for blocking a current path based on the second MOS transistor unit 660.

In the stress applying mode, stress may be applied to at least one of each of the PMOS transistors and NMOS transistors of the calibration circuit 600 identically or similarly to stress which is applied to the OCD/ODT circuit in a normal operation, and thus, characteristics of the MOS transistors of the calibration circuit 600 may be changed identically or similarly to a change in characteristics of the OCD/ODT circuit. Accordingly, the calibration circuit 600 may generate the pull-up control code PCODE_OCD or the pull-down control code NCODE_OCD by compensating for a change in characteristics of the OCD/ODT circuit.

Figure 15:
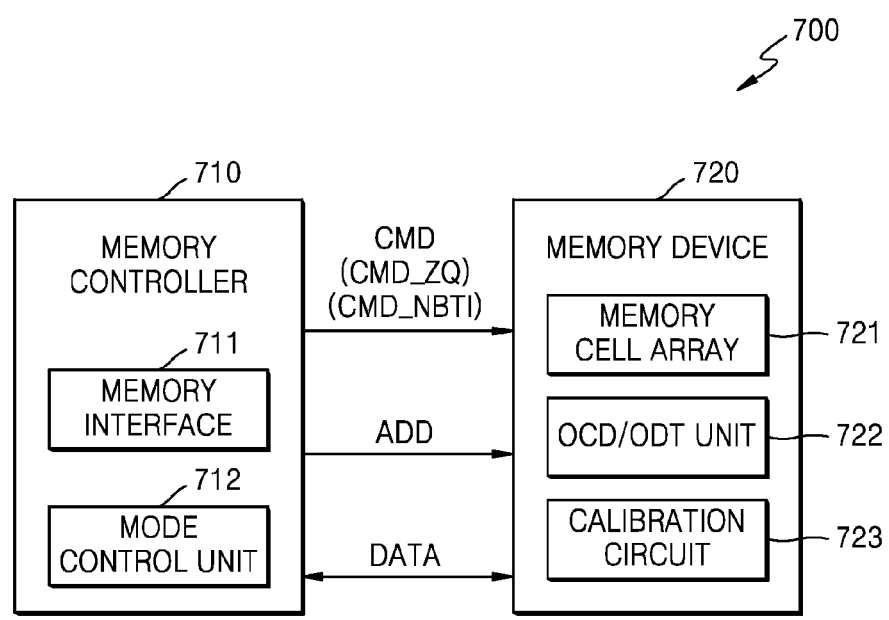
FIG. 15 is a block diagram illustrating a memory system according to example embodiments.

FIG. 15 is a block diagram illustrating a memory system 700 according to certain embodiments.

Referring to FIG. 15, the memory system 700 may include a memory controller 710 and a memory device 720. The memory controller 710 may include a memory interface 711 and a mode control unit 712. Also, the memory device 720 may include a memory cell array 721, an OCD/ODT unit 722, and a calibration circuit 723.

The memory controller 710 may supply a command CMD and an address ADD to the memory device 720 through the memory interface 711 and may also transmit or receive data DATA to or from the memory device 720. According to the above-described embodiments, the OCD/ODT unit 722 may include a pull-up unit and a pull-down unit and may operate based on a pull-up control code and a pull-down control code which are supplied from the calibration circuit 723. Also, according to the above-described embodiments, the calibration circuit 723 may operate in the calibration mode, the off mode, and the stress applying mode.

The memory controller 710 may supply a calibration command CMD_ZQ to the memory device 720 periodically or in an initial operation of the memory system 700. The calibration circuit 723 may operate in the calibration mode in response to the calibration command CMD_ZQ, and when generation of the pull-up control code and the pull-down control code is completed, the calibration circuit 723 may enter the off mode. Also, as in the above-described embodiment, the calibration circuit 723 may enter the stress applying mode in various methods.

For example, the memory controller 710 may supply a command CMD_NBTI, which issues a request to enter the stress applying mode, to the memory device 720. The memory device 720 may activate the stress enable signal NBTI_EN according to the above-described embodiments in response to the command CMD_NBTI.

The mode control unit 712 may perform various determination operations in association with a memory operation of the memory system 700 to determine a time when the stress applying mode enters. The memory controller 710 may generate the command CMD_NBTI which issues a request to enter the stress applying mode, based on a result of the determination. For example, the memory controller 710 may determine whether to supply a write command to the memory device 720, and based on a result of the determination, the memory device 720 may be controlled in order for the calibration circuit 723 to operate in the stress applying mode during a certain period. Alternatively, the memory controller 710 may periodically or aperiodically output the command CMD_NBTI, based on a timing determination operation or a counting determination operation.

Figure 16:
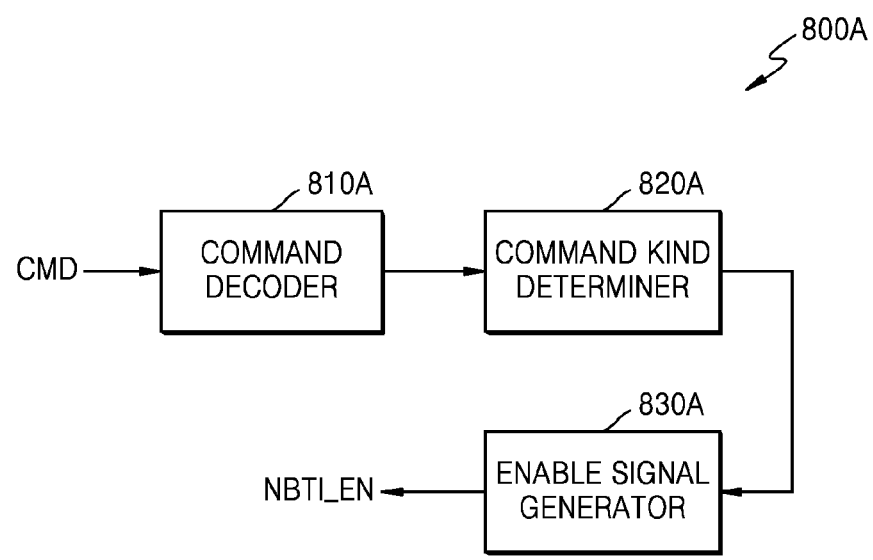
FIGS. 16 and 17 are block diagrams illustrating various examples of activating a stress enable signal according to example embodiments.
Figure 17:
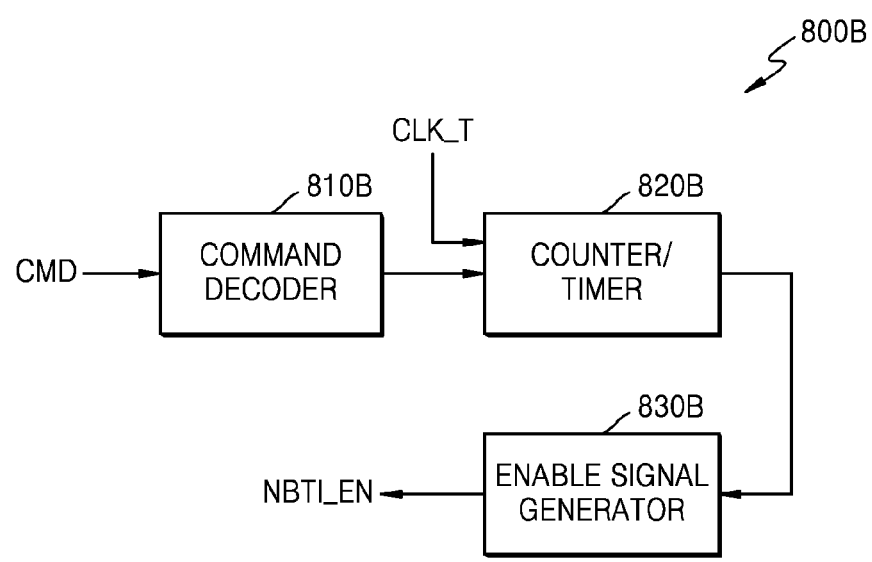

FIGS. 16 and 17 are block diagrams illustrating various examples of activating a stress enable signal NBTI_EN according to example embodiments.

Referring to FIG. 16, a memory device 800A may include a command decoder 810A, a command kind determiner 820A, and an enable signal generator 830A. The memory device 800A may include a calibration circuit (not shown) as described above, and the calibration circuit may operate in the stress applying mode according to a command supplied from a memory controller.

For example, the command decoder 810A may decode a command CMD supplied from the memory controller to generate a decoding result. For example, different decoding results may be generated based on a kind of the command CMD. The command kind determiner 820A may determine whether the command CMD is a certain kind of command, and for example, may determine whether the command CMD is a write command which requests writing of data. A result of the determination may be supplied to the enable signal generator 830A.

The enable signal generator 830A may activate the stress enable signal NBTI_EN when the command CMD supplied from the memory controller is the write command. Therefore, when the memory device 800A performs a write operation, the calibration circuit may operate in the stress applying mode during a certain period, based on the write operation. The NBTI effect may be applied to an OCD/ODT circuit included in the memory device 800A in the write operation, and based on the NBTI effect, the NBTI stress may be applied to some elements of the calibration mode in the stress applying mode. Therefore, as disclosed in the above-described embodiments, the impedance matching characteristic of the OCD/ODT circuit is prevented from being degraded.

Referring to FIG. 17, a memory device 800B may include a command decoder 810B, a counter/timer 820B, and an enable signal generator 830B. The counter/timer 820B may optionally include a counter or a timer. Also, the counter/timer 820B may receive a decoding result from the command decoder 810B or may receive a clock signal CLK_T.

In the embodiment of FIG. 17, the memory device 800B may perform control in order for a calibration circuit to operate in the stress applying mode, based on a counting or timing determination result. For example, as time elapses, characteristics of an OCD/ODT circuit are periodically or aperiodically changed due to the NBTI effect, and the stress applying mode may be periodically or aperiodically executed in order for the NBTI stress to be applied to some elements of the calibration circuit.

For example, the counter/timer 820B may count the number of command receptions to provide a result of the counting. For example, a counting operation may be performed whenever a command is received, irrespective of a kind of the command, and whenever the counting result reaches a certain value, a signal indicating the certain value of the counting result may be supplied to the enable signal generator 830B. Alternatively, the counting operation may be performed whenever a certain command (for example, a write command) is received, and whenever the counting result reaches the certain value, the signal indicating the certain value of the counting result may be supplied to the enable signal generator 830B. Alternatively, the counting operation may be performed for the clock signal CLK_T having a certain period, and whenever the counting result reaches the certain value, the signal indicating the certain value of the counting result may be supplied to the enable signal generator 830B.

Alternatively, based on an operation of the timer included in the counter/timer 820B, whenever a time corresponds to a certain period, a signal indicating that the time corresponds to the certain period may be supplied to the enable signal generator 830B. The enable signal generator 830B may activate and output a stress enable signal NBTI_EN in response to a received signal.

Figure 18:
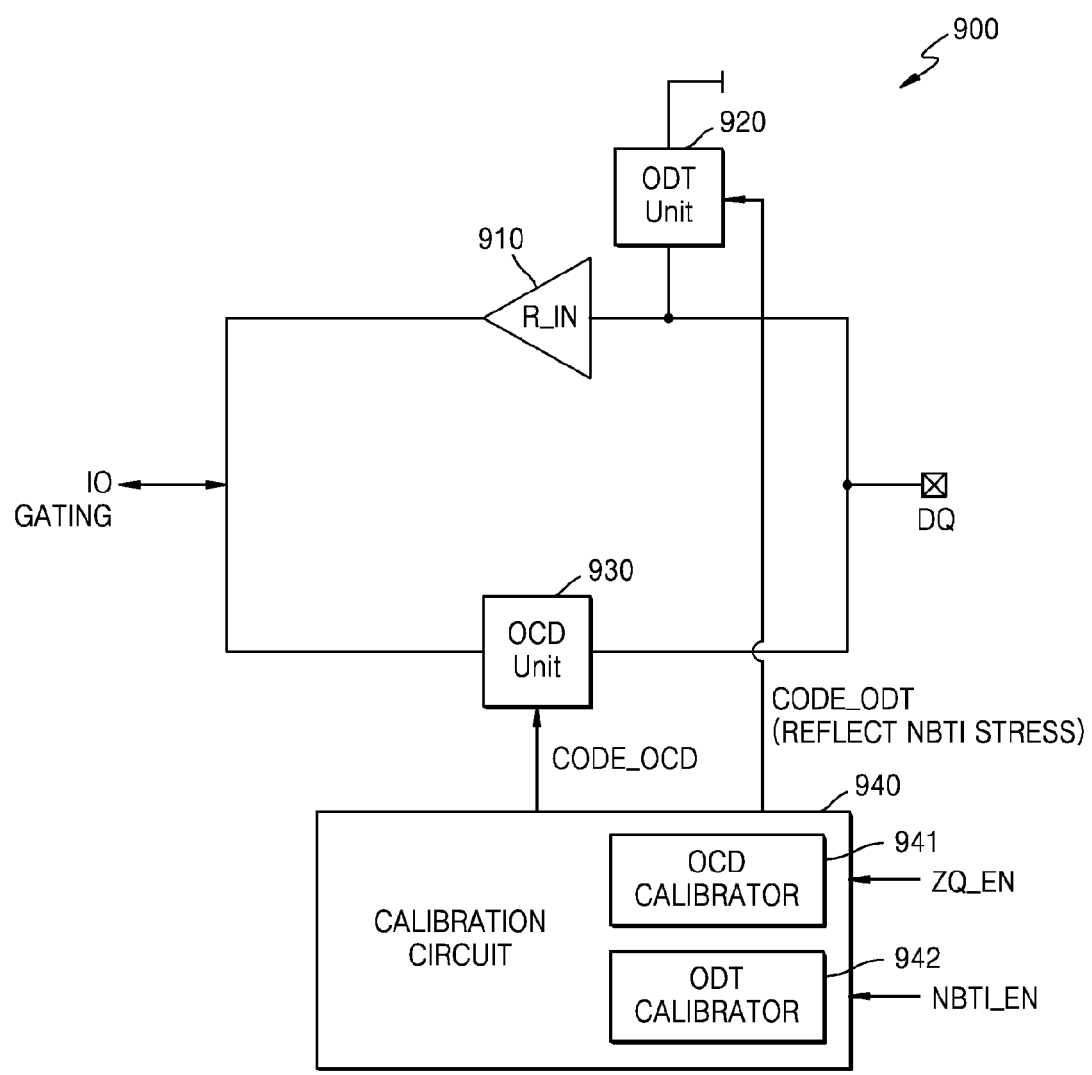
FIG. 18 is a block diagram illustrating a memory device according to example embodiments.

FIG. 18 is a block diagram illustrating a memory device 900 according to example embodiments.

As illustrated in FIG. 18, the memory device 900 may include an input buffer 910 connected to an input/output (IO) pad DQ, an ODT unit 920, and an OCD unit 930. That is, the ODT unit 920 and the OCD unit 930 may be implemented independently from each other. Also, the memory device 900 may further include a calibration circuit 940, and the calibration circuit 940 may include an OCD calibrator 941 and an ODT calibrator 942.

In a data write operation, input data may be supplied to an IO gating unit through the input buffer 910, and the ODT unit 920 may supply a termination resistance to an input terminal of the input buffer 910. Also, in a data read operation, output data may be supplied to the outside through the OCD unit 930. The calibration circuit 940 may supply an ODT control code CODE_ODT, generated in the calibration mode, to the ODT unit 920 and may supply the OCD control code CODE_OCD to the OCD unit 930.

According to the above-described embodiments, the calibration circuit 940 may operate in the stress applying mode. In order to compensate for a change in characteristics of the ODT unit 920 caused by the NBTI effect, the NBTI stress may be selectively applied to the ODT calibrator 942 of the calibration circuit 940. For example, when a stress enable signal NBTI_EN is activated, the calibration circuit 940 may apply the NBTI stress to at least one of PMOS transistors included in the ODT calibrator 942 according to a method which is the same as or similar to the above-described embodiments.

Subsequently, the calibration circuit 940 may supply the ODT control code CODE_ODT having a changed value to the ODT unit 920. That is, when the NBTI stress is applied to the ODT calibrator 942, the ODT control code CODE_ODT in which the NBTI stress is reflected may be supplied to the ODT unit 920.

Figure 19:
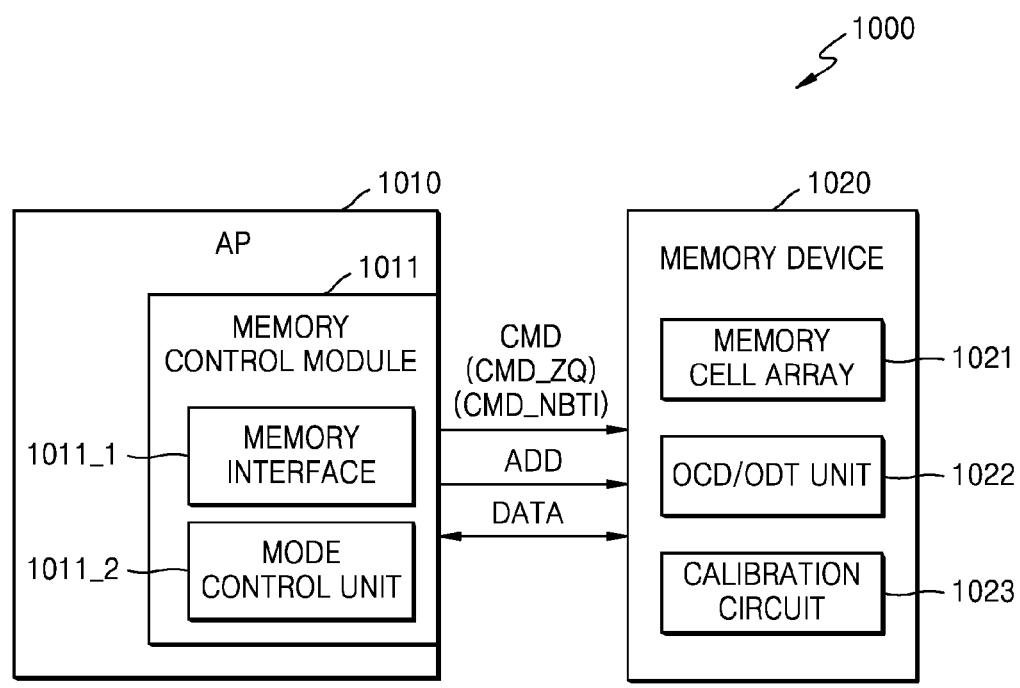
FIG. 19 is a diagram illustrating a data processing system including a memory controller and a memory device according to example embodiments.

FIG. 19 is a diagram illustrating a data processing system 1000 including a memory controller and a memory device according to example embodiments.

As illustrated in FIG. 19, the data processing system 1000 may include an application processor 1010, which operates as a host, and a memory device 1020. The memory device 1020 may use various kinds of memories. For example, a DRAM according to the above-described embodiments may be applied to the memory device 1020, or various memory devices (for example, a nonvolatile memory such as a resistive memory or the like) to which an ODT or OCD circuit is applied may be applied to the memory device 1020. Also, although not shown in FIG. 19, the memory device 1020 according to an embodiment may be implemented as an embedded memory in the application processor 1010.

The application processor 1010 may be implemented as a system-on chip (SoC). The SoC may include a system bus (not shown) to which a protocol based on certain bus standard is applied, and may include various intellectual properties (IPs) connected to the system bus. Advanced microcontroller bus architecture (AMBA) protocol of Advanced RISC Machine (ARM) may be applied as standard protocol of the system bus. A bus type of the AMBA protocol may include advanced high-performance bus (AHB), advanced peripheral bus (APB), AXI, AX14, AXI coherency extensions (ACE), and/or the like. In addition, other types of protocols such as nNetwork of SONICs Inc., CoreConnect of IBM, open core protocol of OCP-IP, and/or the like may be applied to the system bus.

The application processor 1010 may include a memory control module 1011 for controlling the memory device 1020, and the memory control module 1011 may include a memory interface 1011_1 and a mode control unit 1011_2. Also, the memory device 1020 may include a memory cell array 1021, an OCD/ODT unit 1022, and a calibration circuit 1023. The memory control module 1011 may output a command CMD, an address ADD, and data DATA through the memory interface 1011_1. Also, the application processor 1010 may supply a calibration command CMD_ZQ to the memory device 720 periodically or in an initial operation of the data processing system 1000, thereby allowing the calibration circuit 1023 to generate a pull-up/pull-down control code.

Moreover, according to an embodiment, the mode control unit 1011_2 may control the memory device 1020 in order for the calibration circuit 1023 to operate in the stress applying mode. For example, according to the above-described embodiments, the mode control unit 1011_2 may determine a time when the calibration circuit 1023 enters the stress applying mode. Based on a result of the determination, the memory control module 1011 may generate a command CMD_NBTI which issues a request to enter the stress applying mode. The calibration circuit 1023 may apply the NBTI stress to transistors (for example, PMOS transistors) included therein in response to the command CMD_NBTI.

In the embodiment of FIG. 19, an element (for example, the mode control unit) for determining whether to enter the stress applying mode is illustrated as being included in the memory control module 1011, but the present embodiment is not limited thereto. For example, identically or similarly to the above-described embodiments, a function of the mode control unit 1011_2 may be included in the memory device 1020.

Figure 20:
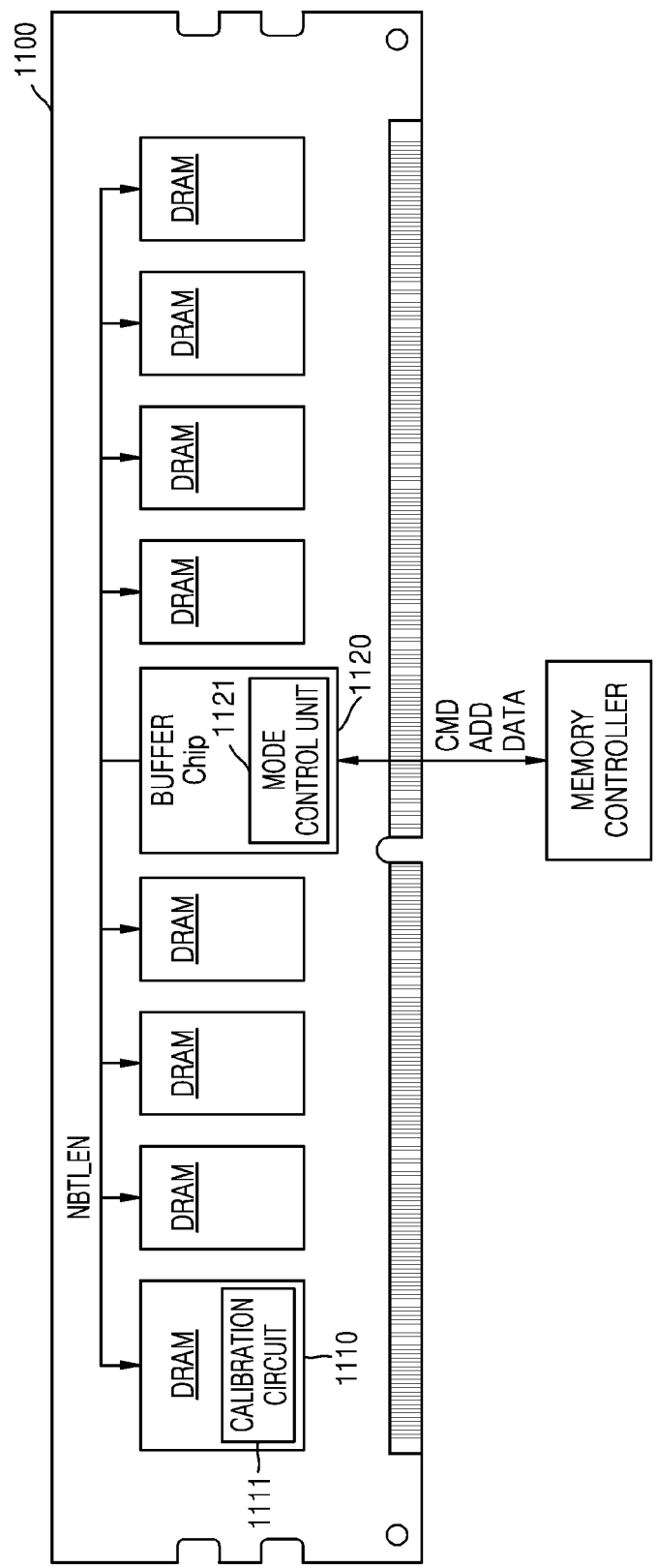
FIG. 20 is a diagram illustrating a memory module according to example embodiments.

FIG. 20 is a diagram illustrating a memory module 1100 according to example embodiments.

Referring to FIG. 20, the memory module 1100 may include a plurality of memory chips 1110 and a buffer chip 1120. The memory module 1100 may be one of various types of memory modules, and for example, may be a load reduced dual in-line memory module (LR-DIMM) or another memory module. The memory module 1100 may be connected to a memory controller through the buffer chip 1120 to receive a command CMD, an address ADD, and data DATA.

The buffer chip 1120 may control a calibration operation of each of the memory chips 1110 according to the command CMD and the address ADD which are supplied from the memory controller. For example, the buffer chip 1120 may include a mode control unit 1121. The buffer chip 1120 may internally determine a timing for entering the stress applying mode or may determine a timing for entering the stress applying mode according to the command CMD from the memory controller. The buffer chip 1120 may supply a stress enable signal NBTI_EN to the memory chips 1110 according to a result of the determination. A calibration circuit 1111 of each of the memory chips 1110 according to above disclosed embodiments may enter the stress applying mode in response to the stress enable signal NBTI_EN, and thus, the NBTI stress may be applied to the calibration circuit 1111.

As described above, the calibration circuit having the stress applying mode and the memory device including the same according to the embodiments compensate for the characteristic change of the ODT/OCD circuit which occurs due to the elapse of time, thereby enhancing the impedance matching characteristic of the ODT/OCD circuit and signal integrity.

While the present disclosure has been particularly shown and described with reference to embodiments thereof, it will be understood that various changes in form and details may be made therein without departing from the spirit and scope of the following claims.

What is claimed is:

1. A memory device comprising:
    a calibration circuit configured to perform a calibration operation of generating a pull-up control code and a pull-down control code in a calibration mode of the memory device, the calibration circuit including a first set of transistors to which the pull-up control code is supplied, a second set of transistors to which the pull-down control code is supplied, and a third set of transistors connected to a first pad;
    an output driver circuit, a resistance value of the output driver circuit being adjusted in response to at least one bit of the pull-up control code and at least one bit of the pull-down control code; and
    a mode control circuit configured to generate a stress enable signal for allowing the calibration circuit to enter a first mode of the memory device,
    wherein the calibration circuit is configured such that the pull-up control code has a logic state which activates at least one transistor of the first set of transistors in the calibration mode and in the first mode different from the calibration mode.

2. The memory device of claim 1, wherein the calibration circuit is configured such that when the memory device is in the first mode, the second set of transistors are turned off.

3. The memory device of claim 1, wherein the mode control circuit is configured to activate the stress enable signal during a certain period in response to a write or read command.

4. The memory device of claim 1, wherein the mode control circuit is configured to activate the stress enable signal during a certain period, based on a number of counts of write or read operations.

5. The memory device of claim 1, further comprising:
    a memory cell array including a plurality of memory cells,
    wherein the output driver circuit is connected to a second pad, and is configured to output data of the memory cell array to the second pad.

6. The memory device of claim 1, wherein:
    the first set of transistors is connected to a power voltage,
    the calibration circuit further includes a switch circuit disposed between the third set of transistors and the first pad, and the switch circuit is turned on in the calibration mode and is turned off in the first mode.

7. The memory device of claim 1, wherein:
the first set of transistors is connected to a power voltage,
the second set of transistors is connected between the first set of transistors and a ground voltage, and
the third set of transistors is supplied by either the pull-up control code or the pull-down control code.

8. The memory device of claim 1, wherein:
the output driver circuit comprises a fourth set of transistors including a plurality of first PMOS transistors and a fifth set of transistors including a plurality of first NMOS transistors,
the first set of transistors includes a plurality of second PMOS transistors,
the second set of transistors includes a plurality of second NMOS transistors, and
at least one of the plurality of first PMOS transistors and at least one of the plurality of second PMOS transistors are turned on in the first mode.

9. A calibration circuit for controlling an output driver circuit of a memory device, the calibration circuit comprising:
a first set of PMOS transistors configured to be used to generate a pull-up control code that is supplied to the output driver circuit;
a first code control circuit configured to supply a first internal code to the first set of PMOS transistors in a calibration mode, and to generate the pull-up control code according to a calibration result;
a first set of NMOS transistors configured to be used to generate a pull-down control code that is supplied to the output driver circuit; and
a second code control circuit configured to supply a second internal code to the first set of NMOS transistors in the calibration mode, and to generate the pull-down control code according to a calibration result,
wherein the calibration circuit is configured such that the pull-up control code has a logic state which activates at least one PMOS transistor of the first set of PMOS transistors in the calibration mode and in a stress applying mode different from the calibration mode.

10. The calibration circuit of claim 9, wherein:
the first code control circuit is configured to receive a calibration enable signal for the calibration mode and a stress enable signal for the stress applying mode,
the first code control circuit is configured to, during a period where the stress enable signal is deactivated after the calibration mode is ended, output the first internal code to turn off the first set of PMOS transistors, and
the first code control circuit is configured to, during a period where the stress enable signal is activated after the calibration mode is ended, output the first internal code having a logic state which activates at least one of the first set of PMOS transistors.

11. The calibration circuit of claim 10, further comprising:
a switch circuit disposed between a pad and the first set of PMOS transistors, the pad connected to an external resistor; and
a set of replica transistors connected to the first set of NMOS transistors, the set of replica transistors configured to receive the first internal code,
wherein in the stress applying mode, the switch circuit is turned off in response to the stress enable signal.

12. The calibration circuit of claim 10, further comprising:
a set of replica transistors connected between the first set of PMOS transistors and a ground voltage, the set of replica transistors configured to receive the second internal code,
wherein the first set of NMOS transistors is connected to an external resistor through a pad, and
wherein, in the stress applying mode, the set of replica transistors is turned off.

13. The calibration circuit of claim 9, wherein a value of the pull-up control code which is generated before the stress applying mode is entered differs from a value of the pull-up control code which is generated after the stress applying mode is entered.

14. A memory device comprising:
a calibration circuit including a first set of transistors connected to a first power voltage, a second set of transistors connected to the first set of transistors and a second power voltage, and a third set of transistors connected to a first pad, the calibration circuit configured to, when the memory device is in a calibration mode, generate a first pull-up control code supplied to the first set of transistors and to generate a first pull-down control code supplied to the second set of transistors,
wherein the calibration circuit is configured to:
in the calibration mode, generate the first pull-up control code having a logic state which activates at least one transistor of the first set of transistors, and
in a first mode of the memory device different from the calibration mode, generate the first pull-up control code having a logic state which activates at least one transistor of the first set of transistors.

15. The memory device of claim 14, further comprising:
a first circuit configured to, when the memory device is entered into the first mode, generate a first control signal,
wherein the calibration circuit is configured to generate the first pull-up control code in response to the first control signal.

16. The memory device of claim 15, wherein the calibration circuit is configured to, when the memory device is in the calibration mode and in the first mode, generate the first pull-up control code to apply a negative voltage between a gate and a source of at least a first transistor of the first set of transistors.

17. The memory device of claim 14, further comprising:
a memory cell array including a plurality of memory cells; and
an output driver including a fourth set of transistors connected to the first power voltage and a fifth set of transistors connected to the fourth set of transistors and a second pad, the output driver configured to output data of the memory cell array to the second pad,
wherein the calibration circuit is further configured to generate a second pull-up control code applied to the fourth set of transistors, and to generate a second pull-down control code applied to the fifth set of transistors.

18. The memory device of claim 17, wherein the first pull-up control code is the same as or different from the second pull-up control code.

19. The memory device of claim 14, wherein when the memory device is in the first mode, the first pull-down control code has a logic state which deactivates all transistors of the second set of transistors.

* * * * *